(12) United States Patent
Shimanuki

(10) Patent No.: US 10,515,934 B2
(45) Date of Patent: *Dec. 24, 2019

(54) SEMICONDUCTOR DEVICE

(71) Applicant: Renesas Electronics Corporation, Koutou-ku, Tokyo (JP)

(72) Inventor: Yoshihiko Shimanuki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/990,750

(22) Filed: May 28, 2018

(65) Prior Publication Data
US 2018/0277522 A1    Sep. 27, 2018

Related U.S. Application Data

(60) Continuation of application No. 14/820,282, filed on Aug. 6, 2015, now Pat. No. 9,991,229, which is a
(Continued)

(30) Foreign Application Priority Data

Jan. 6, 2006 (JP) .................... 2006-1027

(51) Int. Cl.
*H01L 25/065* (2006.01)
*H01L 23/00* (2006.01)
(Continued)

(52) U.S. Cl.
CPC ...... *H01L 25/0657* (2013.01); *H01L 23/3107* (2013.01); *H01L 23/49838* (2013.01);
(Continued)

(58) Field of Classification Search
CPC ... H01L 23/03; H01L 23/34; H01L 24/05–06; H01L 24/48–49; H01L 24/85; H05K 8/04; H05K 8/06
(Continued)

(56) References Cited

U.S. PATENT DOCUMENTS 5,473,514 A    12/1995 Nagano
5,905,639 A    5/1999 Warren
(Continued)

FOREIGN PATENT DOCUMENTS

JP    2000-307057 A    2/2000
JP    2004-87747 A    3/2004
(Continued)

OTHER PUBLICATIONS

Office Action dated Jan. 9, 2013 and Search Report dated Jan. 2, 2013, in Taiwanese Patent Application No. 095144886.
(Continued)

*Primary Examiner* — Tuan T Dinh
(74) *Attorney, Agent, or Firm* — Shapiro, Gabor and Rosenberger, PLLC

(57) ABSTRACT

A semiconductor device including a package substrate having, at the periphery of the main surface thereof, bonding leads disposed in a row, a semiconductor chip mounted inside of the row of the bonding leads on the main surface of the package substrate, wires for connecting pads of the semiconductor chip and the bonding leads of the substrate, a sealing body for resin sealing the semiconductor chip and the wires, and solder bumps disposed on the back surface of the package substrate. The top of a loop of each of the wires is disposed outside the wire connecting portion so that the wire connection between the bonding leads and the pads of the semiconductor chip has a stable loop shape to prevent wire connection failure.

19 Claims, 19 Drawing Sheets

Related U.S. Application Data continuation of application No. 12/985,815, filed on Jan. 6, 2011, now abandoned, which is a division of application No. 11/606,027, filed on Nov. 30, 2006, now Pat. No. 7,889,513.

(51) Int. Cl.
  *H01L 23/498* (2006.01)
  *H01L 23/31* (2006.01)

(52) U.S. Cl.
  CPC .............. *H01L 24/32* (2013.01); *H01L 24/49* (2013.01); *H01L 24/73* (2013.01); *H01L 2224/32145* (2013.01); *H01L 2224/32225* (2013.01); *H01L 2224/4845* (2013.01); *H01L 2224/48106* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06568* (2013.01)

(58) Field of Classification Search
  USPC ................................. 361/770–774, 790, 803
  See application file for complete search history.

(56) References Cited

U.S. PATENT DOCUMENTS

| | | | |
|---|---|---|---|
| 6,621,169 B2 * | 9/2003 | Kikuma | H01L 23/3121 |
| | | | 257/48 |
| 6,670,718 B2 | 12/2003 | Chinda et al. | |
| 6,867,493 B2 | 3/2005 | Hashemi et al. | |
| 6,894,398 B2 | 5/2005 | Pon | |
| 7,115,977 B2 | 10/2006 | Komiyama et al. | |
| 7,276,437 B2 | 10/2007 | Yano et al. | |
| 7,408,261 B2 | 8/2008 | Yoon et al. | |
| 7,479,705 B2 | 1/2009 | Takahashi et al. | |
| 2002/0047213 A1 | 4/2002 | Komiyama et al. | |
| 2002/0153615 A1 | 10/2002 | Komiyama et al. | |
| 2002/0158325 A1 | 10/2002 | Yano et al. | |
| 2003/0001249 A1 | 1/2003 | Shimanuki | |
| 2003/0042621 A1 | 3/2003 | Chen et al. | |
| 2004/0125578 A1 | 7/2004 | Konishi et al. | |
| 2004/0150084 A1 * | 8/2004 | Nishida | H01L 24/49 |
| | | | 257/678 |
| 2005/0139985 A1 | 6/2005 | Takahashi | |
| 2005/0200003 A1 * | 9/2005 | Yoon | B82Y 10/00 |
| | | | 257/723 |
| 2006/0076690 A1 * | 4/2006 | Khandros | H01L 23/13 |
| | | | 257/777 |

FOREIGN PATENT DOCUMENTS

| | | |
|---|---|---|
| JP | 2004-319921 A | 11/2004 |
| JP | 2005-072515 A | 3/2005 |

OTHER PUBLICATIONS

Office Action dated Jun. 7, 2011, in Japanese Patent Application No. 2006-001027.

Office Action dated Aug. 4, 2015, in Taiwanese Patent Application No. 102125650.

Office Action dated Jan. 12, 2017, in Taiwanese Patent Application No. 105106184.

* cited by examiner

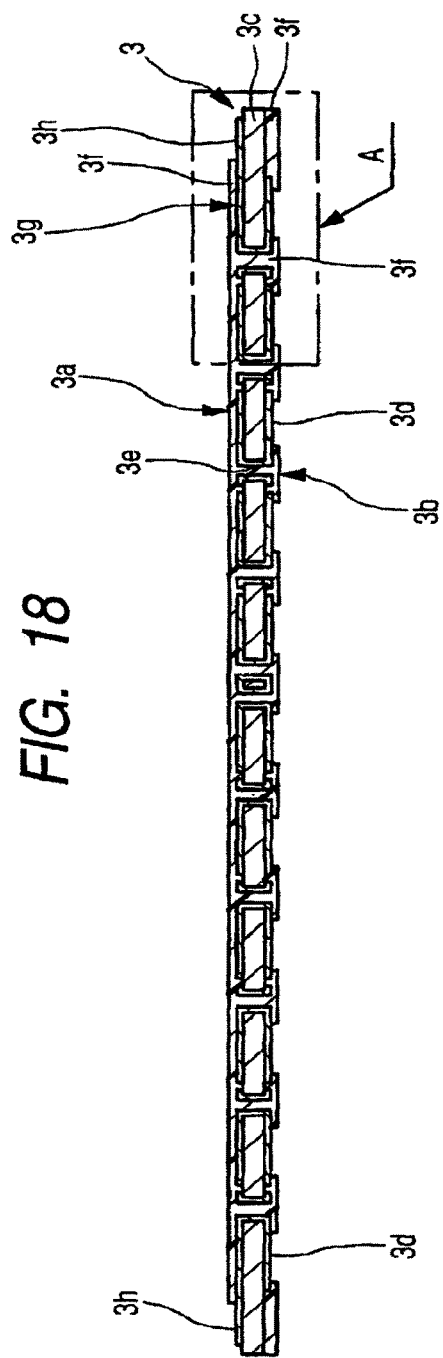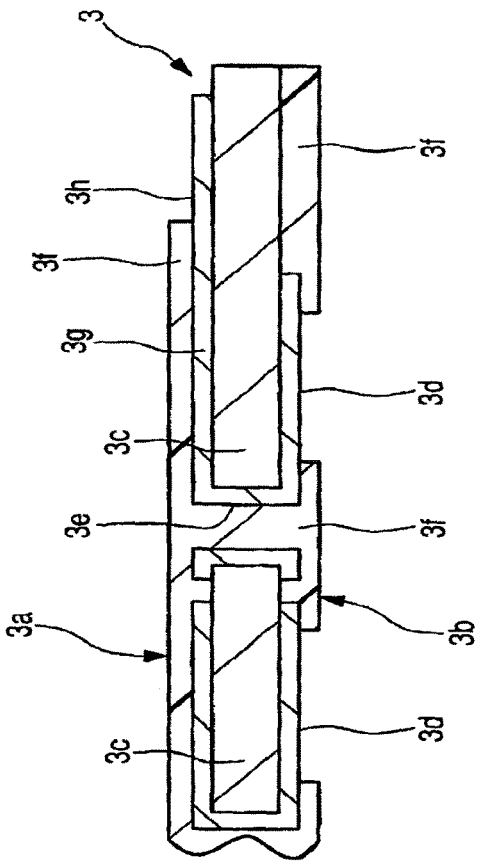

SEMICONDUCTOR DEVICE

CROSS-REFERENCE TO RELATED APPLICATION

The present application claims priority from Japanese patent application No. 2006-1027 filed on Jan. 6, 2006, the content of which is hereby incorporated by reference into this application.

BACKGROUND OF THE INVENTION

The present invention relates to a semiconductor manufacturing technology, particularly to a technology effective when applied to prevention of connection failure in wire bonding.

There is proposed a technology in which after formation of a neck at a first bonding point, a capillary is elevated while paying out a predetermined length of a wire and is moved toward a second bonding point to form a first marking portion; the capillary is descended and moved toward a direction opposite to the second bonding point to form a second marking portion; and the capillary is elevated to pay out the wire until the first marking portion is located at the tip end of the capillary and while keeping this state, the capillary is moved toward the second bonding point to form a wire loop (refer to, for example, Japanese Unexamined Patent Publication No. 2004-87747 (FIG. 2)).

There is also proposed a technology which comprises connecting a wire to a first bonding point; slightly elevating a capillary and performing first reverse operation; elevating the capillary and performing second reverse operation; elevating the capillary and performing third reverse operation; horizontally moving the capillary in a direction opposite to a second bonding point by closing a clamper; horizontally moving the capillary in a direction of the second bonding point by opening the clamper; and elevating the capillary to the upper portion of the first bonding point to pay out the wire for connecting it to the second bonding point (refer to, for example, Japanese Unexamined Patent Publication No. 2004-319921 (FIG. 1)).

SUMMARY OF THE INVENTION

A semiconductor device called CSP (Chip Size Package) in which a chip and a semiconductor package (wiring substrate) are almost equal in size is known as one example of semiconductor devices developed to satisfy the demand for downsizing.

In the CSP, the distance between the end portion (end side) of a semiconductor chip and the end portion (end side) of a wiring board is as narrow (small) as about 0.2 to 0.3 mm so that the distance between the end portion (end side) of the semiconductor chip and a bonding lead (terminal) formed on the main surface of the wiring substrate for wire bonding is about 0.1 mm and thus very narrow (small). When wire bonding is performed by the so-called forward bonding system in which a point to be connected with the electrode of the semiconductor chip is on the first side and a point to be connected with a bonding lead formed on the main surface of the wiring substrate is on the second side, the wire may fail to enter between the capillary and chip end.

Described specifically, as illustrated in a comparison example of FIG. 27, a portion of a capillary 18 is brought into contact with a wire 4 pulled down from the first side to the second side. Interference with the wire 4 can be prevented by extending a portion (L) from the root to the tip of the capillary 18 subjected to supplementary processing. A nail head bonding system using ultrasonic wave in combination is employed in wire bonding so that when the narrow portion L is too long, the capillary 18 bends at the narrow portion, which disturbs smooth conduction of ultrasonic wave to the tip of the capillary 18.

In the case of forward bonding, the wire 4 is drawn from a position higher than the second side when the wire 4 on the second side is contact bonded, which tends to cause friction between a portion of the capillary 18 and the wire 4 at a position A as illustrated in FIG. 27. The portion of the capillary 18 is therefore easily worn away.

As described in the above-described patent documents (such as Japanese Unexamined Patent Publications Nos. 2004-87747 and 2004-319921), wire connection failure can be prevented by employing, for the wire connection, a so-called reverse bonding system in which a point to be connected with a bonding lead formed on the main surface of a wiring substrate is on a first (first bond) side, while a point to be connected with the electrode of a semiconductor chip is on the second (second bond) side. By this system, the wire is vertically raised to almost the same height as the second side existing at a higher position from the first side existing at a lower position and then, it is connected to the second side existing at a higher position by moving the capillary horizontally. The root of the wire does not bend on the first side, resulting in the prevention of wire connection failure.

As downsizing of semiconductor devices proceeds, owing to a very narrow distance, about 0.1 mm, between a bonding lead formed on the main surface of a wiring substrate and an end portion (end side) of a semiconductor chip as described above, wire connection by the reverse bonding system may cause, as illustrated in a small package 30 of Comparative Example in FIG. 28, contact of the wire 4 to the end portion of the chip, because the margin of the wire is too small to bend down the wire to the second side in the final stage.

In other words, there is a mismatch between a feed rate of the wire 4 from a spool and a moving speed of the capillary 18 and the moving speed of the capillary 18 is faster than the feed rate of the wire 4. This leads to insufficient wire feeding. The wire 4 thus formed is short and instable so that shorting of the wire with the end portion of the chip may cause a wire connection failure. In particular, when a test pattern is formed at the end portion of the main surface 1a of the semiconductor chip 1, shorting between the wire 4 and the test pattern also poses a problem.

An object of the present invention is to provide a technology capable of preventing wire connection failure.

The above-described and the other object and novel features of the present invention will be apparent from the description herein and accompanying drawings.

Outline of inventions, typical of the inventions disclosed by the present application, will next be described briefly.

In one aspect of the present invention, there is thus provided a semiconductor device comprising a wiring substrate having a plurality of terminals arranged along the periphery of the main surface, a semiconductor chip mounted inside of the array of the terminals on the main surface of the wiring substrate, and a plurality of wires for connecting the electrodes of the semiconductor chip to the terminals on the wiring substrate, the terminals on the wiring substrate being connected as a first bond and the electrodes of the semiconductor chip being connected as a second bond, wherein a portion of each wire is disposed on a side closer than the periphery than the wire connecting portion at each terminal of the wiring substrate.

In another aspect of the present invention, there is also provided a manufacturing method of a semiconductor device, which comprises the steps of: connecting a semiconductor chip to a wiring substrate, connecting a tip portion of a wire to a terminal of the wiring substrate, moving a capillary to a direction distant from the semiconductor chip to pull the wire from the terminal, disposing the capillary on the electrode of the semiconductor chip, and connecting a portion of the wire to the electrode of the semiconductor chip, wherein a portion of the wire is disposed on a side closer to the periphery than a wire connecting portion at the terminal of the wiring substrate.

Advantages available by inventions typical of the inventions disclosed by the present application will next be described briefly.

Since a portion of the wire is disposed on a side outer than the wire connecting portion of the first bond at the terminal of the wiring substrate, the wire is detoured outside the wire connecting portion. This makes it possible to increase the length of the wire to be used for the connection between the terminal of the wiring substrate and the electrode of the semiconductor chip. The margin of the wire to be used for this purpose accordingly increases and the wire feed rate can follow the moving rate of the capillary, whereby the loop shape of the wire can be stabilized. As a result, shorting between the terminal of the chip and the wire can be reduced and occurrence of wire connection failure can be reduced. Thus, the wire connection failure can be prevented.

BRIEF DESCRIPTION OF THE DRAWINGS

FIG. 18 is a cross-sectional view illustrating the structure of the wiring substrate illustrated in FIG. 16;

FIG. 19 is an enlarged fragmentary view illustrating the structure of the position A illustrated in FIG. 18;

DETAILED DESCRIPTION OF THE INVENTION

Figure 1:
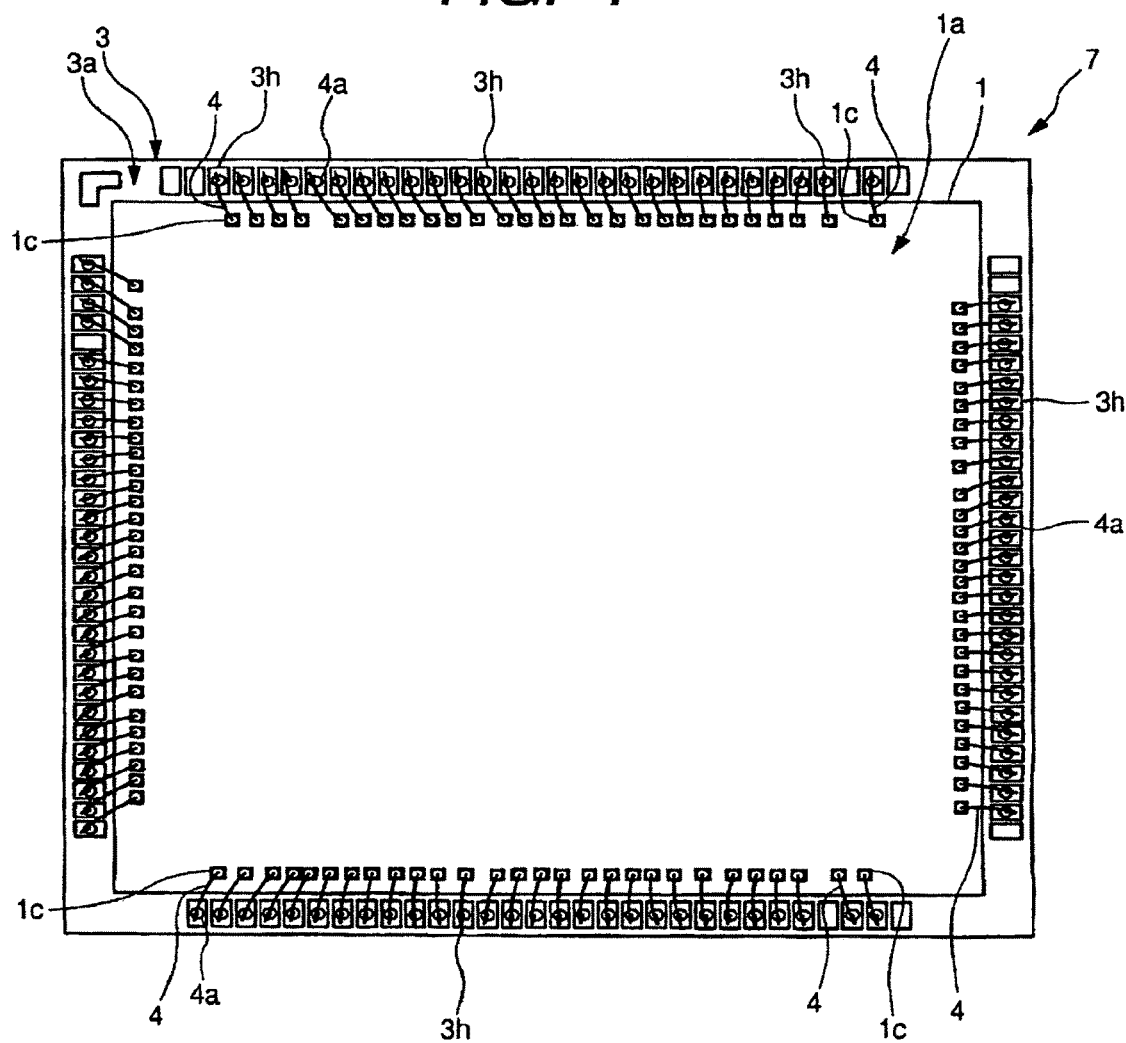
FIG. 1 is a plan view illustrating one example of the structure of a semiconductor device according to Embodiment 1 of the present invention, which is illustrated through a sealing body.

In the below-described embodiments, any description as to the same or like portions will not be repeated in principle unless otherwise particularly necessary.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number of elements is not limited to a specific number but can be greater than or less than the specific number unless otherwise specifically indicated or in the case it is principally apparent that the number is limited to the specific number.

Embodiments of the present invention will hereinafter be described in detail based on accompanying drawings. In all the drawings for describing the below-described embodiments, elements having like function will be identified by like reference numerals and overlapping descriptions will be omitted.

Embodiment 1

Figure 2:
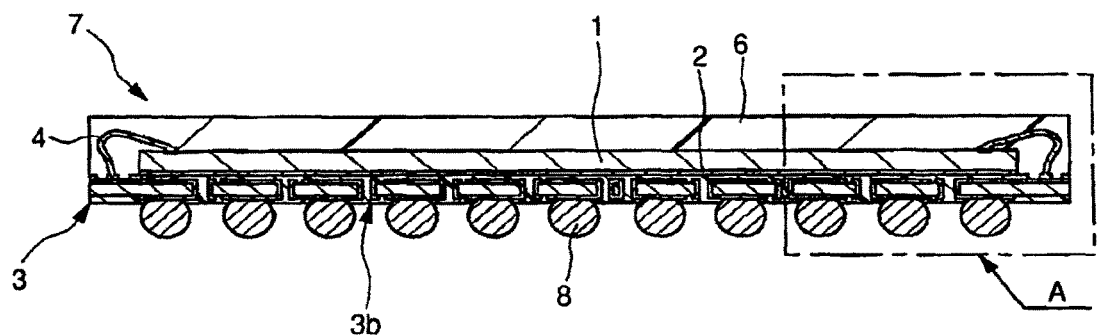
FIG. 2 is a cross-sectional view illustrating one example of the structure of the semiconductor device illustrated in FIG. 1.
Figure 3:
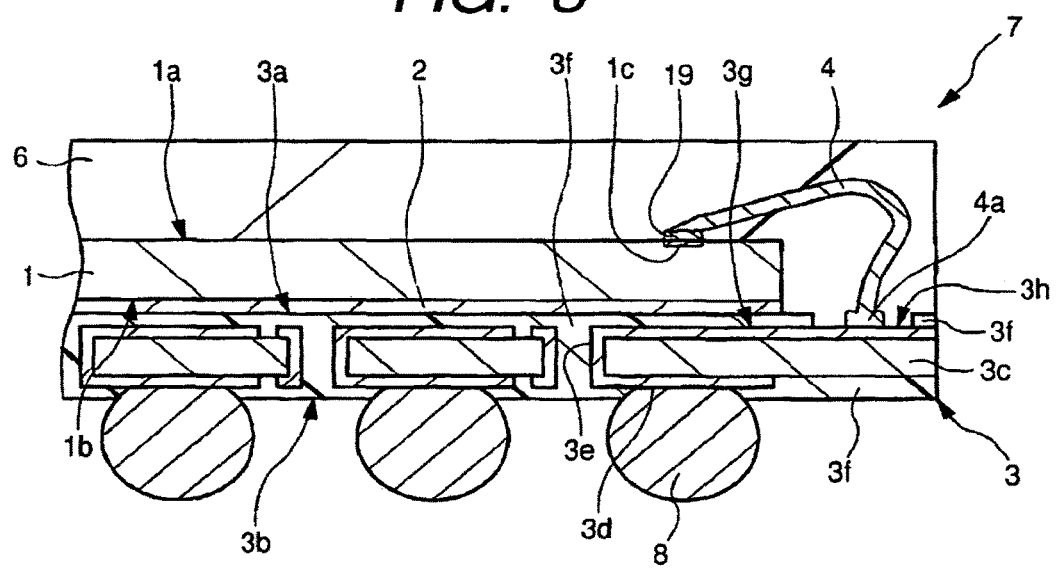
FIG. 3 is an enlarged fragmentary cross-sectional view illustrating the structure of the position A illustrated in FIG. 2.
Figure 4:
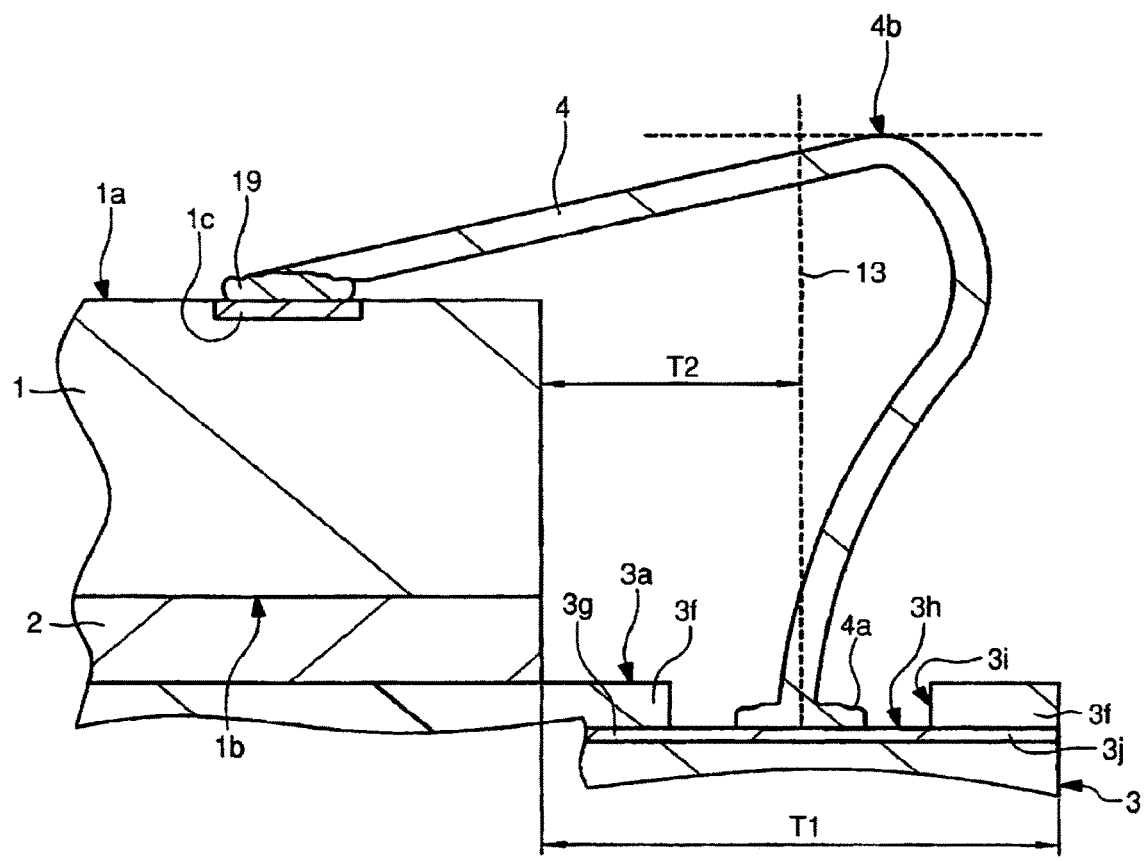
FIG. 4 is an enlarged fragmentary cross-sectional view illustrating one example of the structure of a wire bonded portion illustrated in FIG. 3.
Figure 9:
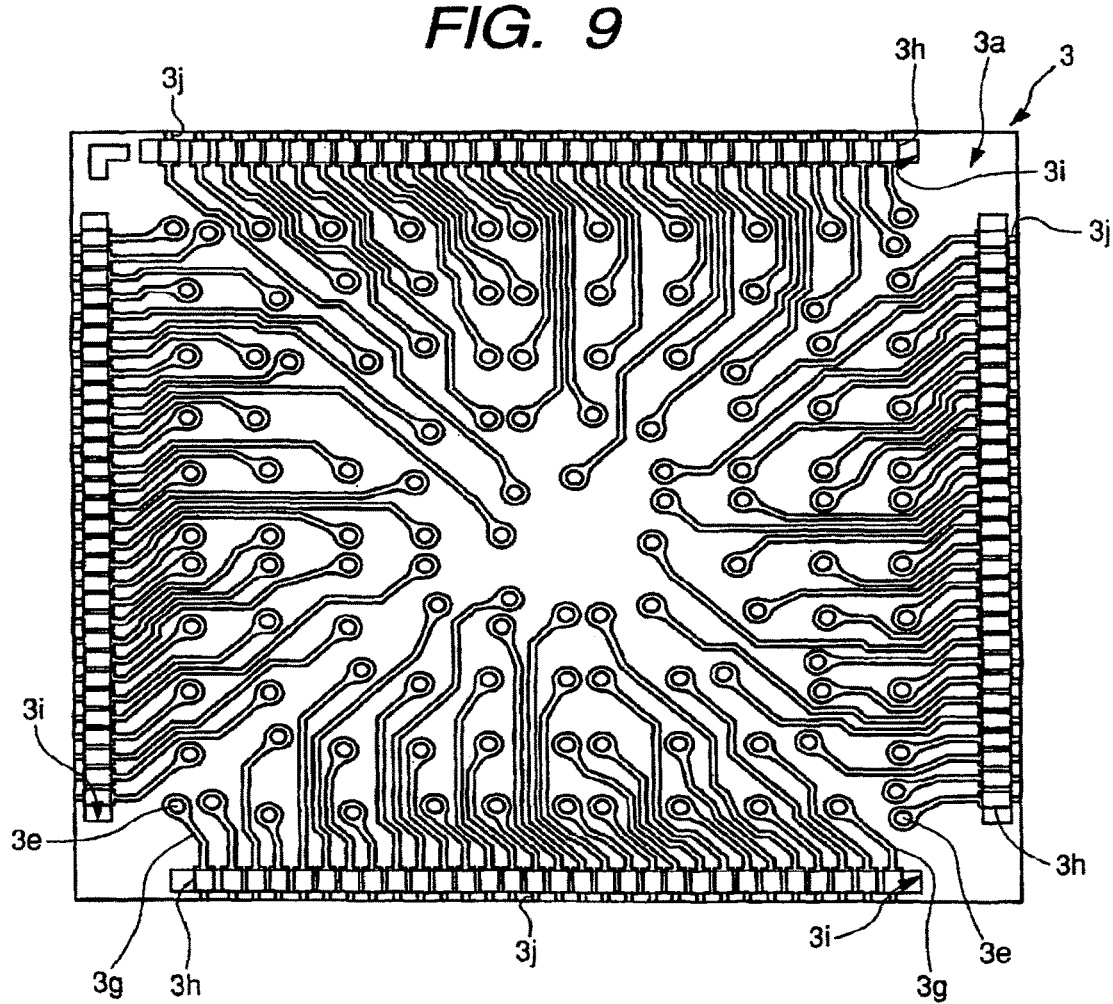
FIG. 9 is a plan view illustrating one example of a wiring pattern on the main surface side of a wiring substrate to be incorporated in the semiconductor device illustrated in FIG. 1.
Figure 10:
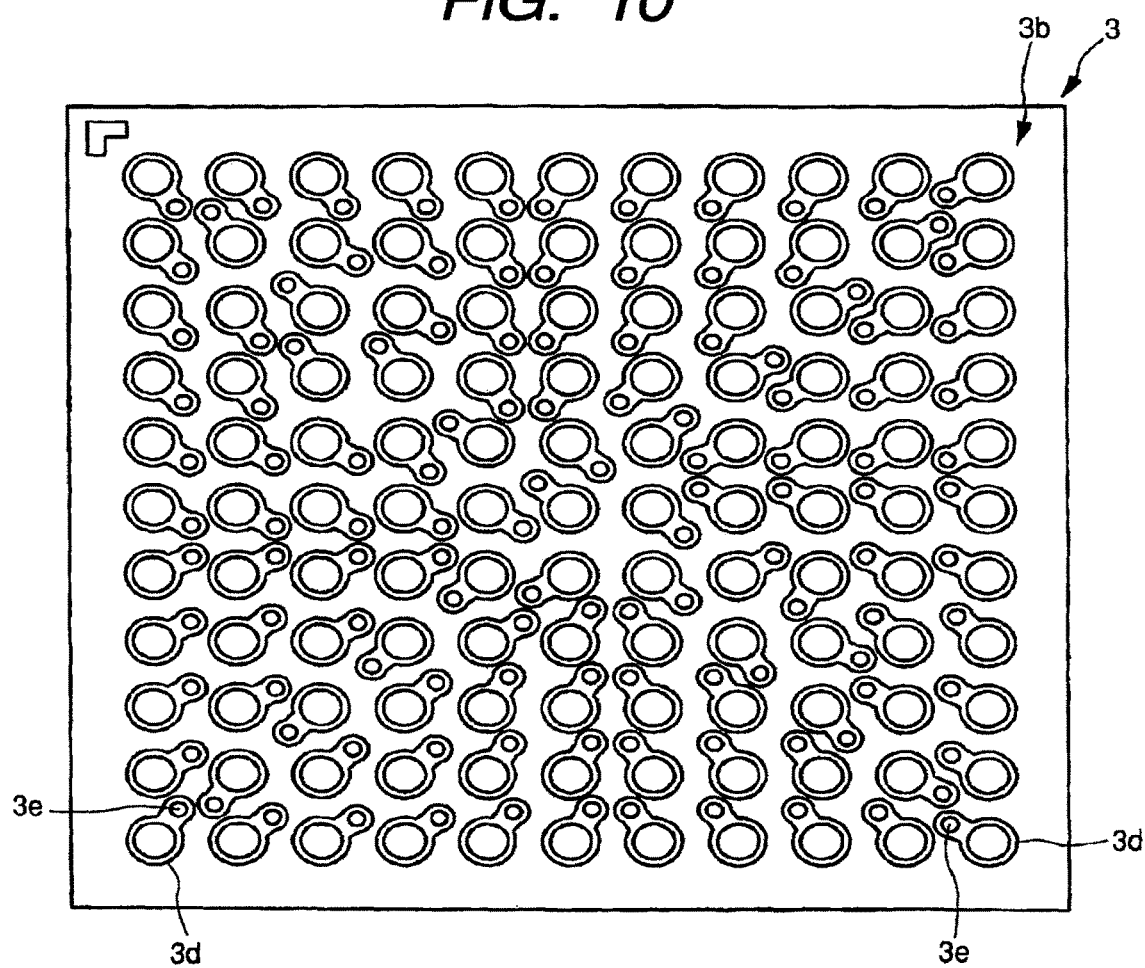
FIG. 10 is a back side view illustrating one example of a wiring pattern on the back surface side of the wiring substrate illustrated in FIG. 9.
Figure 11:
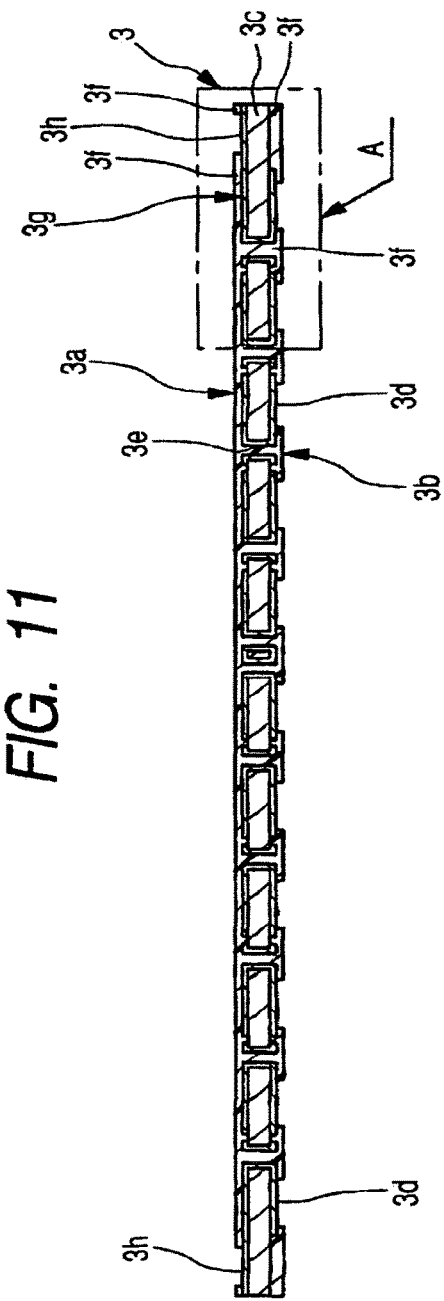
FIG. 11 is a cross-sectional view illustrating one example of the structure of the wiring substrate illustrated in FIG. 9.
Figure 12:
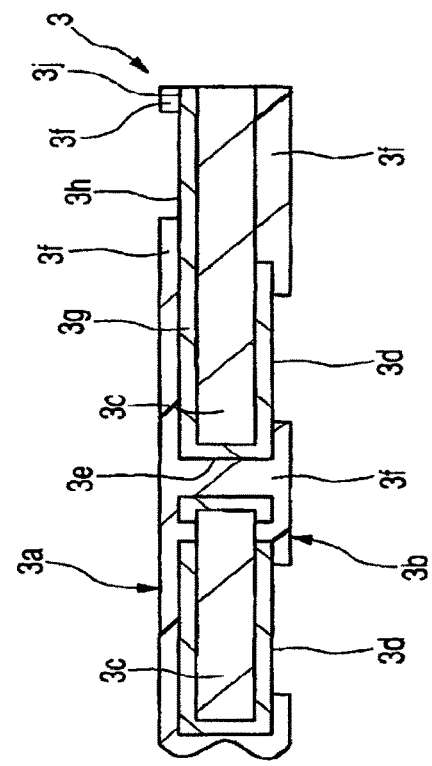
FIG. 12 is an enlarged fragmentary cross-sectional view illustrating the structure of the position A illustrated in FIG. 11.
Figure 13:
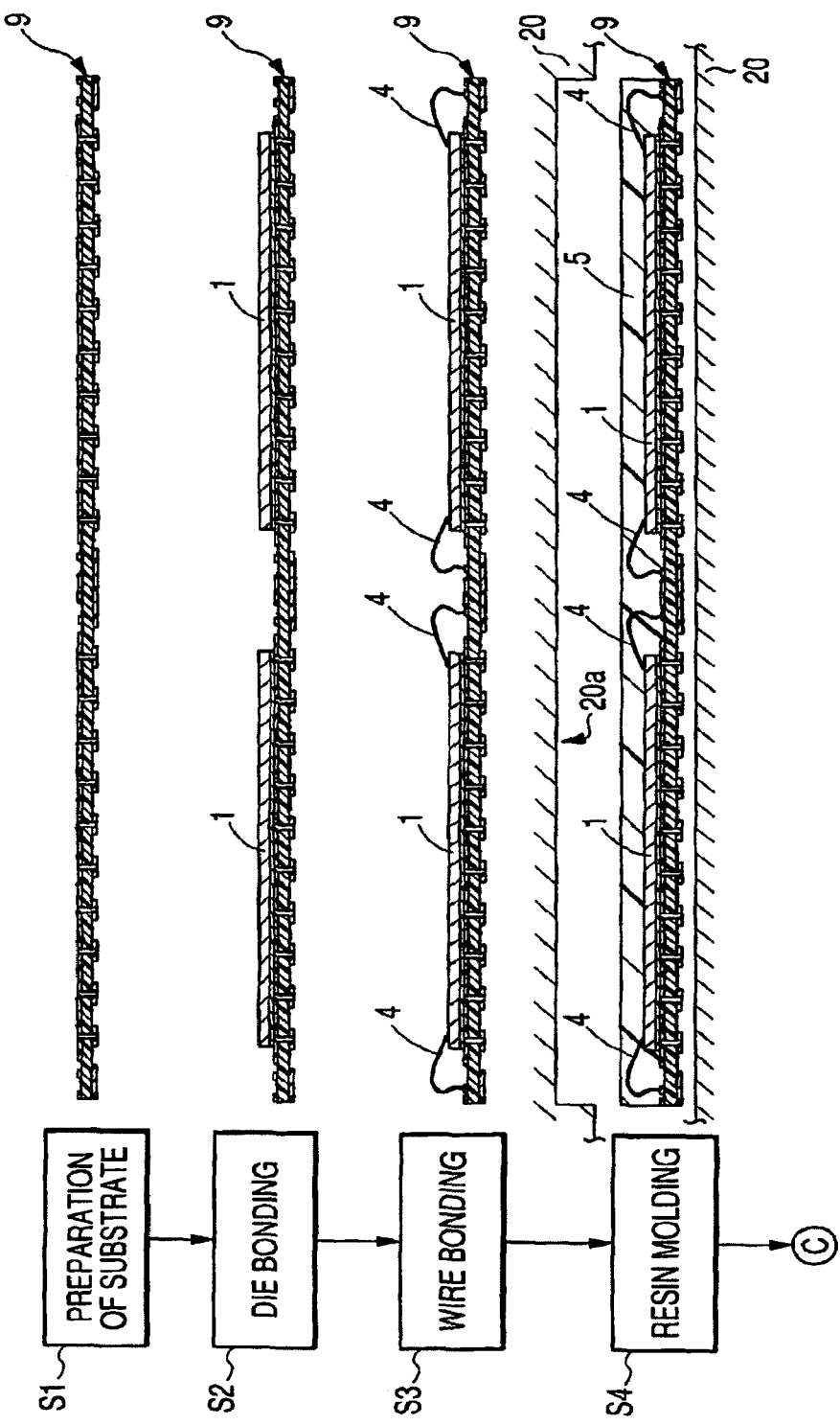
FIG. 13 is a flow chart of a manufacturing process illustrating one example of the fabrication steps up to resin molding in the fabrication of the semiconductor device illustrated in FIG. 1.
Figure 15:
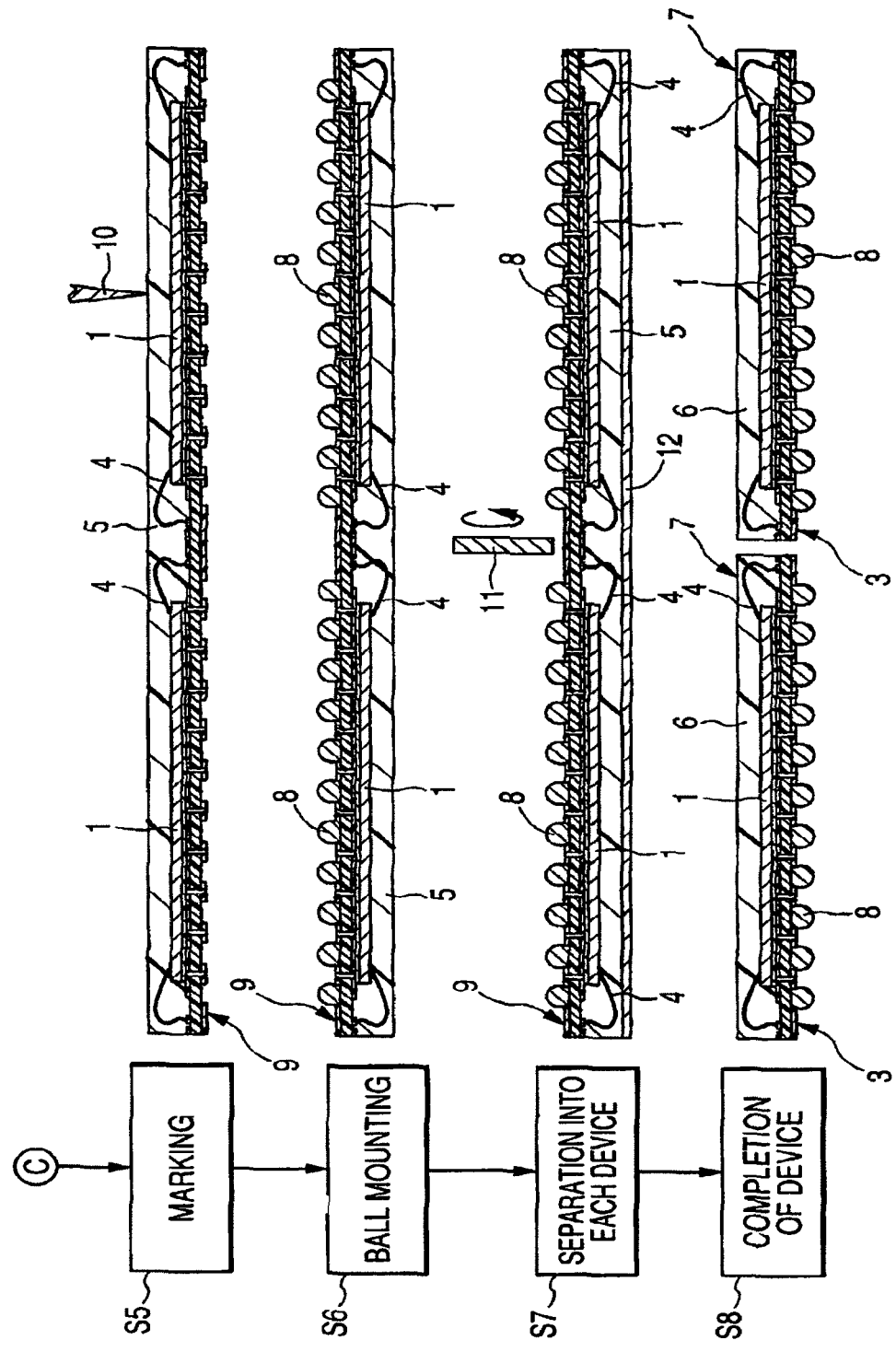
FIG. 15 is a flow chart of a manufacturing process illustrating a modification example of the fabrication steps after resin molding in the fabrication of the semiconductor device illustrated in FIG. 1.

FIG. 1 is a plan view illustrating one example of the structure of a semiconductor device according to Embodiment 1 of the present invention, which is illustrated through a sealing body; FIG. 2 is a cross-sectional view illustrating one example of the structure of the semiconductor device illustrated in FIG. 1; FIG. 3 is an enlarged fragmentary cross-sectional view illustrating the structure of the position A illustrated in FIG. 2; FIG. 4 is an enlarged fragmentary cross-sectional view illustrating one example of the structure of a wire bond portion illustrated in FIG. 3; and FIGS. 5 to 8 are cross-sectional views each illustrating one example of the movement locus of the capillary at the time of wiring illustrated in FIG. 4. FIG. 9 is a plan view illustrating one example of a wiring pattern on the main surface side of a wiring substrate incorporated in the semiconductor device illustrated in FIG. 1; FIG. 10 is a back side view illustrating one example of a wiring pattern on the back surface side of the wiring substrate illustrated in FIG. 9; FIG. 11 is a cross-sectional view illustrating one example of the structure of the wiring substrate illustrated in FIG. 9; and FIG. 12 is an enlarged fragmentary cross-sectional view illustrating the structure of the position A illustrated in FIG. 11. FIG. 13 is a flow chart of a manufacturing process illustrating one example of the fabrication steps up to resin molding in the fabrication of the semiconductor device illustrated in FIG. 1; and FIG. 15 is a flow chart of a manufacturing process illustrating a modification example of the fabrication after resin molding in the fabrication of the semiconductor device illustrated in FIG. 1.

Figure 16:
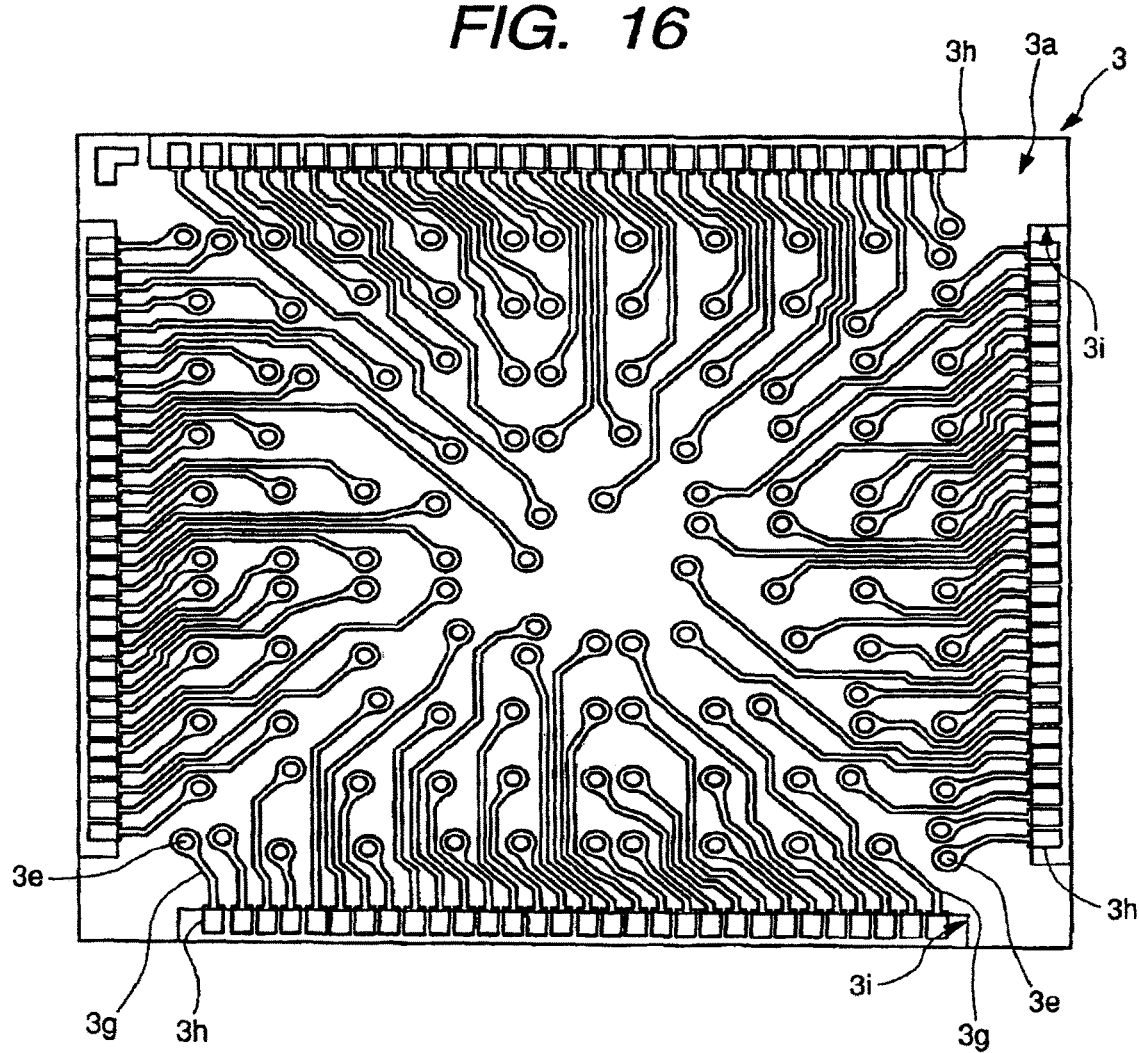
FIG. 16 is a plan view illustrating a wiring pattern on the main surface side of a wiring substrate in the modification example of Embodiment 1 of the present invention.
Figure 17:
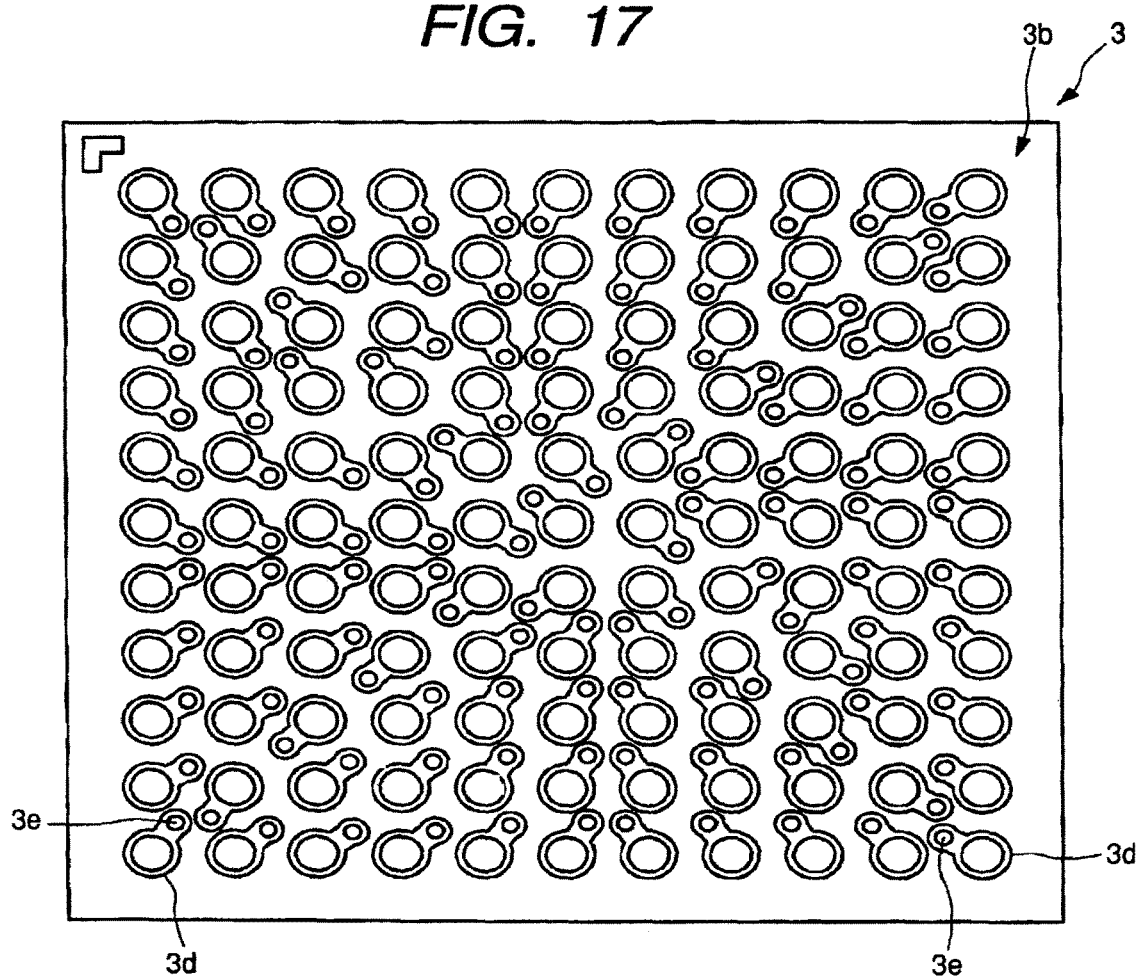
FIG. 17 is a back side view illustrating a wiring pattern on the back surface side of the wiring substrate illustrated in FIG. 16.
Figure 20:
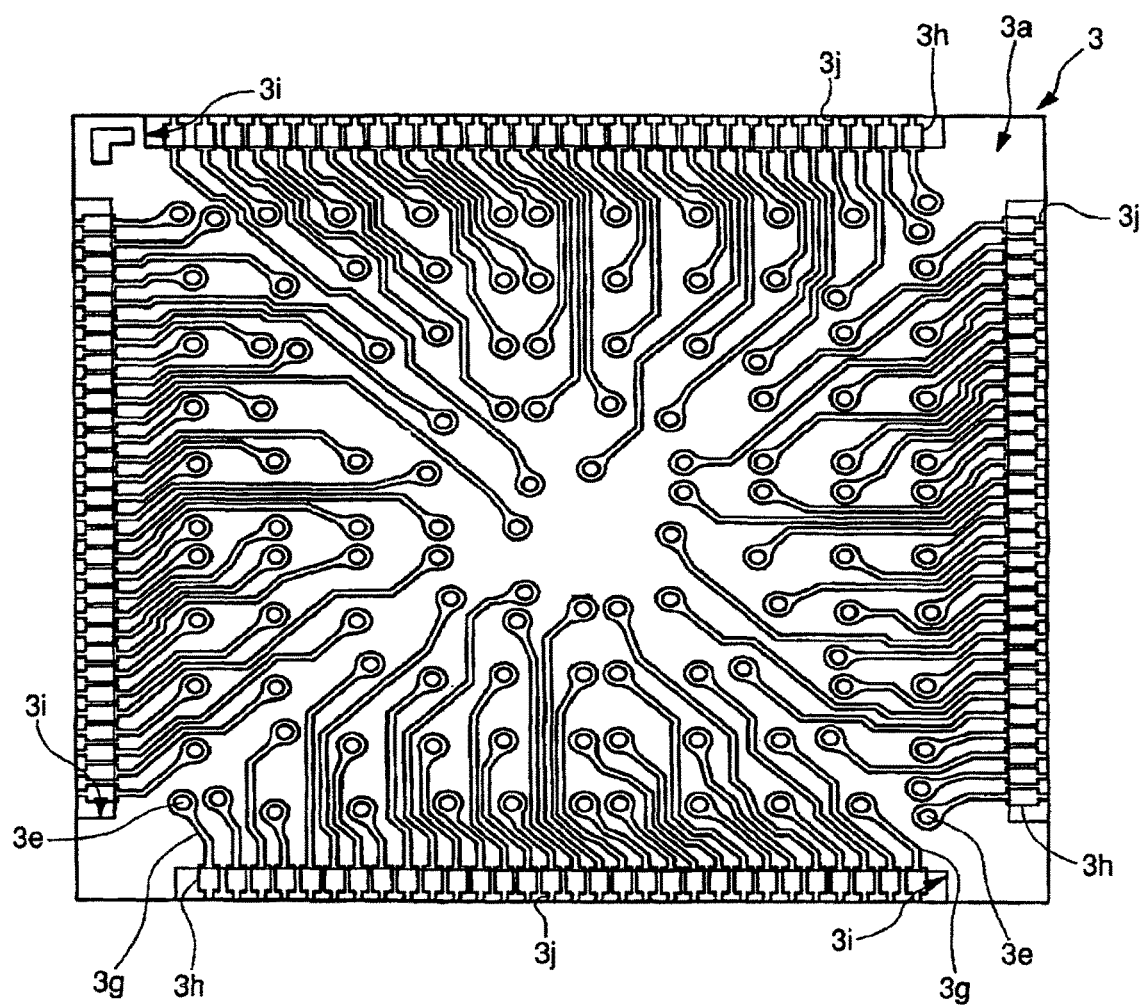
FIG. 20 is a plan view illustrating a wiring pattern on the main surface side of a wiring substrate of another modification example of Embodiment 1 of the present invention.
Figure 21:
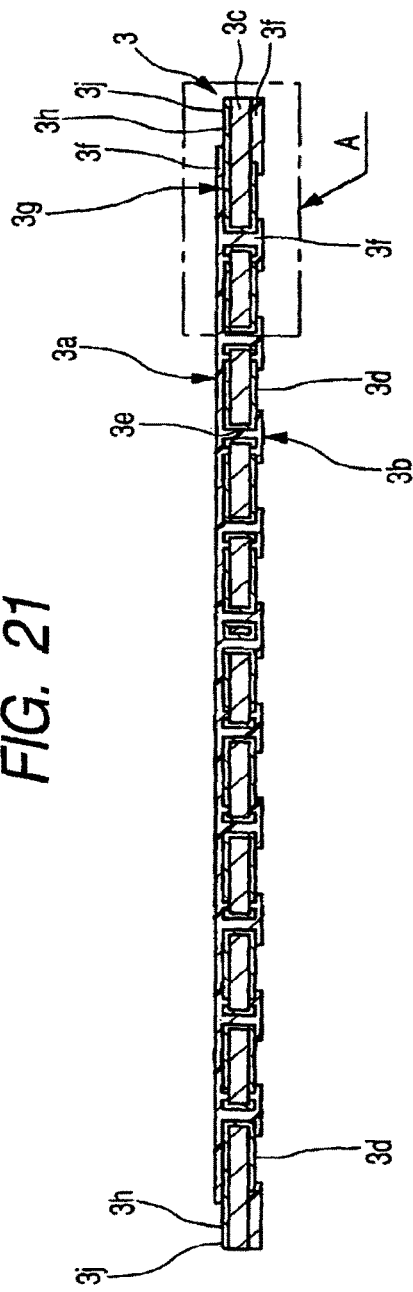
FIG. 21 is a cross-sectional view illustrating the structure of the wiring substrate illustrated in FIG. 20.
Figure 22:
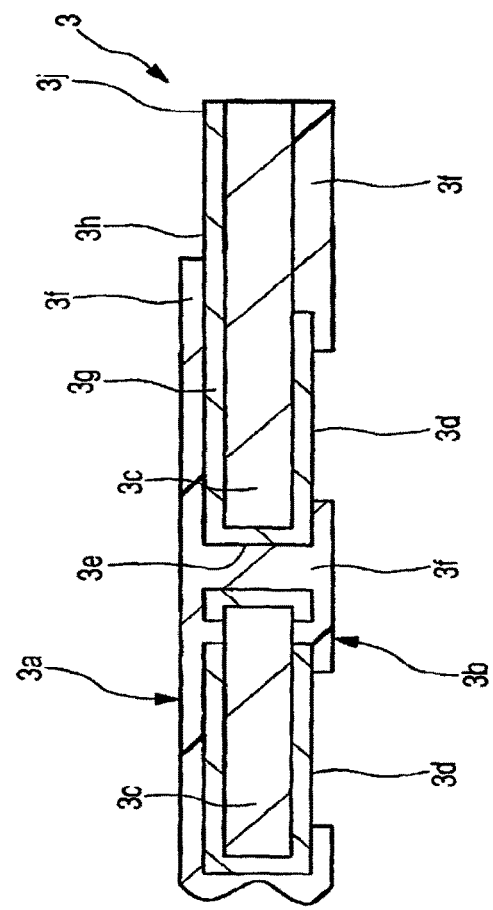
FIG. 22 is an enlarged fragmentary cross-sectional view illustrating the structure of the portion A illustrated in FIG. 21.

FIG. 16 is a plan view illustrating a wiring pattern on the main surface side of a wiring substrate in a modification example of Embodiment 1 of the present invention; FIG. 17 is a back side view illustrating a wiring pattern on the back surface side of the wiring substrate illustrated in FIG. 16; FIG. 18 is a cross-sectional view illustrating the structure of the wiring substrate illustrated in FIG. 16; FIG. 19 is an enlarged fragmentary cross-sectional view illustrating the structure of the position A illustrated in FIG. 18; FIG. 20 is a plan view illustrating a wiring pattern on the main surface side of a wiring substrate of another modification example of Embodiment 1 of the present invention; FIG. 21 is a cross-sectional view illustrating the structure of the wiring substrate illustrated in FIG. 20; and FIG. 22 is an enlarged fragmentary cross-sectional view illustrating the structure of the position A illustrated in FIG. 21.

The semiconductor device according to Embodiment 1 is a resin-sealed small semiconductor package having a semiconductor chip 1 mounted on a wiring substrate. As one example of Embodiment 1, CSP 7 as illustrated in FIGS. 1 to 3 will be described here.

In the CSP 7, a plurality of solder bumps 8 which are external terminals are arranged in a grid pattern and mounted on a back surface 3b of the wiring substrate so that the CSP 7 is a BGA (Ball Grid Array) type semiconductor package.

Referring to FIGS. 1 to 3, a description will be provided of the structure of the CSP 7. The CSP 7 is equipped with a package substrate 3 which is a wiring substrate having a main surface 3a, the back surface 3b opposite to the main surface 3a, and a plurality of bonding leads (terminals) 3h arranged at the periphery of the main surface 3a and a semiconductor chip 1 which is mounted inside (a region inside of the plurality of bonding leads 3h) of the row of the bonding leads on the main surface 3a of the package substrate 3 and has an integrated circuit. It is also equipped with conductive wires 4 for electrically connecting between pads 1c which are electrodes of the semiconductor chip 1 and the bonding leads 3h of the package substrate 3, a die bonding film 2 which is a die bonding material disposed between the main surface 3a of the package substrate 3 and the semiconductor chip 1 (attached in advance onto the back surface of the semiconductor chip 1), and a plurality of solder bumps 8 which are external terminals (external connection terminals) disposed on a plurality of lands 3d on the back surface 3b of the package substrate 3. It is equipped further with a sealing body 6 for sealing the semiconductor chip 1 and plurality of wires 4 with a resin. The semiconductor chip 1 is fixed, via the die bonding film 2, onto a solder resist film 3f which is a protection film of the main surface 3a of the package substrate 3.

The CSP 7 is a small semiconductor package in which the semiconductor chip 1 and the package substrate 3 are also equal in size and the package substrate 3 is slightly larger. For example, as illustrated in FIG. 4, the distance (T1) from the end portion of the semiconductor chip 1 to the end portion of the package substrate 3 is about 0.2 to 0.3 mm and is very narrow (small).

Accordingly, the distance (T2) between the end portion (end side) of the semiconductor chip 1 and the bonding lead 3h formed at the periphery (circumference) of the main surface 3a of the package substrate 3 for wire connection is also very narrow (small), about 0.1 mm.

In the CSP 7, as illustrated in FIGS. 1 to 3, the plurality of bonding leads 3h are arranged on the package substrate 3 in a region outside the chip and at the periphery of the substrate. The pads 1c disposed on the main surface 1a of the semiconductor chip 1 and serving as an electrode and the bonding leads 3h on the package substrate 3 are electrically connected via the conductive wires 4 such as gold wire, respectively.

In the CSP 7 according to Embodiment 1, as illustrated in FIG. 1, the plurality of wires 4 electrically connect the pads 1c of the semiconductor chip 1 to the corresponding bonding leads 3h on the package substrate 3 and at the same time, the bonding leads 3h on the substrate side are connected as a first bond, while the pads 1c on the chip side are connected as a second bond.

At the first bond, the bonding leads are each connected by pressing a ball, which has been formed on the tip portion of the wire by an electric torch, against the lead by a capillary 18, while at the second bond, the pads are each connected by pulling the wire 4 from the above-described terminal after first bonding, placing the capillary 18 on the other terminal, crushing a portion of the wire 4 against the other terminal by the capillary 18.

In the CSP 7 according to Embodiment 1, the first bonding is performed for the bonding leads 3h on the package substrate 3, while the second bonding is performed for the pads 1c on the semiconductor chip 1. In other words, the CSP 7 is fabricated by employing reverse bonding for wire bonding in the connection between the pads 1c of the semiconductor chip 1 and the bonding leads 3h of the package substrate 3.

Such a wire bonding system is employed because of the following reason. The CSP 7 is a small semiconductor package in which the semiconductor chip 1 and package substrate 3 are almost equal in size; the distance from the end portion of the chip to the end portion of the substrate is very narrow, about 0.2 to 0.3 mm; and the distance between each of the bonding leads 3h and the end portion of the chip is also very narrow, about 0.1 mm, so that it is difficult to carry out second bonding while sliding and disposing the capillary 18 in a region on the substrate but outside the semiconductor chip 1.

In short, the capillary 18 is moved upward from the bonding leads 3h during wire connection, whereby the first bonding is performed on the substrate side where only a narrow region is secured for wire bonding and the second bonding is performed on the chip side.

In the CSP 7 according to Embodiment 1, as illustrated in FIG. 1, a portion of each of the wires 4 connected by reverse bonding is disposed (formed) outside (outside toward the periphery of the package substrate 3) of a wire connecting portion 4a at the first bond on the bonding lead 3h on the main surface 3a of the package substrate 3.

Described specifically, a top 4b of a loop which is a portion of the wire 4 exists outside of the wire connecting portion 4a at the first bond. This means that the uppermost position (4b in this drawing) of the loop of each wire 4 exists outside (in a direction distant from the semiconductor chip 1) of a center line 13 of the wire connecting portion 4a in the wire delivering direction.

Figure 5:
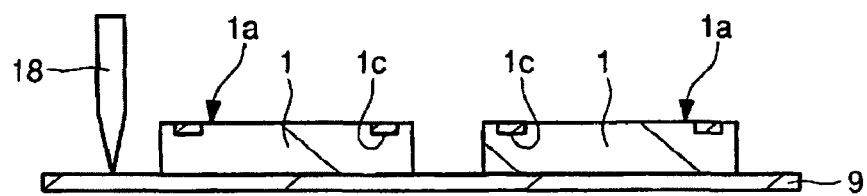
FIG. 5 is a cross-sectional view illustrating one example of the movement locus of the capillary at the time of wiring illustrated in FIG. 4.

A formation process of the loop of the wire 4 illustrated in FIG. 4 will next be described based on FIGS. 5 to 8. First, the first bonding is performed for the bonding lead 3h on the package substrate 3. Described specifically, the tip portion of the wire 4 in the ball form is pressed against the bonding lead 3h of FIG. 4 on the package substrate 3 by means of the capillary 18 as illustrated in FIGS. 4 and 5 and thus, they were connected.

Figure 6:
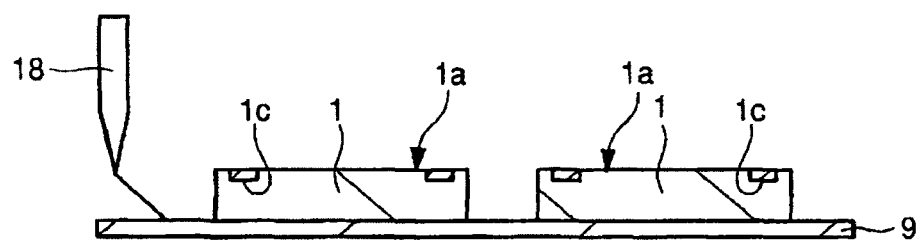
FIG. 6 is a cross-sectional view illustrating one example of the movement locus of the capillary at the time of wiring illustrated in FIG. 4.

As illustrated in FIG. 6, the capillary 18 is then moved in a direction so as to be distant from the semiconductor chip 1 and the wire 4 is pulled from the binding lead 3h. In other words, the wire 4 is pulled from the bonding lead 3h in a direction to be distant from the semiconductor chip 1 (toward the periphery of the package substrate 3) and at the same time in an obliquely upward direction, whereby the wire 4 is pulled obliquely upward from the bonding lead 3h.

Figure 7:
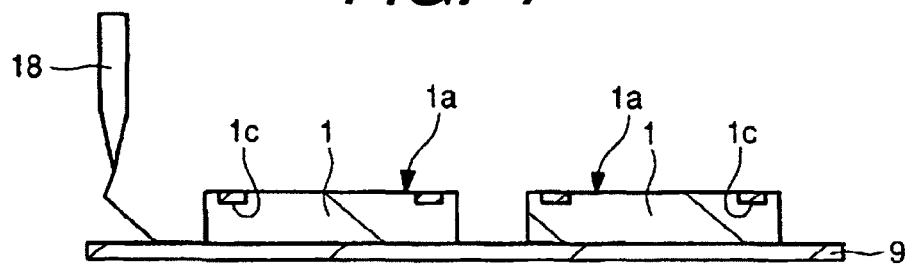
FIG. 7 is a cross-sectional view illustrating one example of the movement locus of the capillary at the time of wiring illustrated in FIG. 4.

The oblique upward movement of the capillary 18 is then terminated at a predetermined position, followed by the transfer of the capillary 18 directly above (vertically above) to pull the wire 4 upward as illustrated in FIG. 7.

Figure 8:
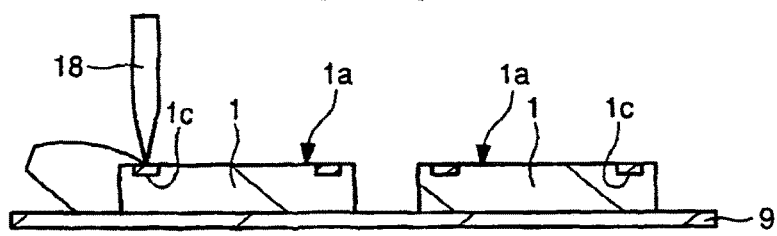
FIG. 8 is a cross-sectional view illustrating one example of the movement locus of the capillary at the time of wiring illustrated in FIG. 4.

When the height of the wire 4 exceeds the height of the chip, the upward movement of the capillary 18 is terminated, followed by substantially horizontal movement of the capillary 18 on the pad 1c of the semiconductor chip 1 as illustrated in FIG. 8, whereby the wire 4 is disposed on the pad 1c of the semiconductor chip 1.

A portion of the wire 4 is crushed by the capillary 18 on the pad 1c to connect the wire 4 to the pad 1c on the semiconductor chip 1, whereby second bonding for connecting the wire 4 to the pad 1c on the semiconductor chip 1 is completed and at the same time, the top 4 of the loop of each wire 4 is disposed outside of the wire connecting portion 4a.

On the pad 1c of the semiconductor chip 1, a gold bump (stuffed bump) 19 is formed in advance. The wire 4 is connected to the gold bump 19 on the pad 1c at the time of second bonding. The following is the reason why the gold bump is formed in advance. At the time of second bonding in the wire bonding step, the wire 4 is contact-bonded to the pad 1c (or bonding lead 3h) by moving the capillary 18 as if rubbing and it is therefore necessary to form the pad 1c of a relatively large size to maintain a space on the pad 1c enough for sliding the capillary thereon. When reverse bonding is employed as in Embodiment 1, formation of the pad 1c of a relatively greater in size on the main surface of the semiconductor chip 1 may lead to difficulty in the downsizing of the semiconductor chip 1. Moreover, when the above-described contact bonding is performed on the main surface of the semiconductor chip 1, a stress is transmitted to the semiconductor chip 1 by the pressure upon contact bonding, which may cause chip cracks particularly when the semiconductor chip 1 is thin and the flexural strength of the chip is low. The gold bump 19 is therefore formed prior to the second bonding. Since the gold bump 19 has lower hardness than the pad 1c, a portion of the wire 4 can be contact-bonded easily under a weak contact-bonding pressure. In addition, formation of the gold bump 19 prior to the first bonding enables recognition of the bonding point at the time of the second bonding in advance of the first bonding. Under a fixed coordinate for the wire bonding, a stable wire bonding step can be carried out. When the semiconductor chip 1 has a relatively large area and is thick, it has high flexural strength so that formation of the gold bump 19 on the pad 1c is not necessary. In this case, the wire 4 is connected to the pad 1c directly.

In the next place, the structure of the package substrate 3 to be incorporated in the CSP 7 illustrated in FIGS. 9 to 12 will be described.

The package substrate 3 has a core material 3c, a plurality of conductor portions formed on the main surface 3a and back surface 3b of the substrate, through-holes 3e for connecting the conductor portions on the main surface 3a to those on the back surface 3b, respectively, and a solder resist film 3f for covering therewith at least a portion of the conductor portions. On the main surface 3a of the package substrate 3, a row of a plurality of bonding leads 3h are disposed at the periphery (circumference) of the substrate along each side, as illustrated in FIG. 9.

The bonding leads 3h are electrically connected to the through-holes 3e via copper wires 3g, respectively. To the bonding leads 3h are connected power feeders 3j, respectively, toward the outside.

The package substrate 3 has, on the back surface 3b thereof, a plurality of lands 3d formed in a grid pattern as illustrated in FIG. 10. To these lands 3d are connected solder bumps 8 (refer to FIG. 3) which are external terminals. The plurality of lands 3d are connected to the through-holes 3e, respectively.

As described above, on the main surface 3a and back surface 3b of the package substrate 3, the conductor portions such as bonding leads 3h, copper wires 3g, power feeders 3j, lands 3d and through-holes 3e are formed. These conductor portions are made of, for example, a copper alloy (Cu). The plurality of lands 3d and bonding leads 3h are subjected to surface treatment, on the copper alloy thereof, with Ni/Au or Ni/Pd/Au in order to improve the connection strength with the conductive wires 4.

The package substrate 3 has, on the main surface 3a and back surface 3b thereof, a solder resist film 3f, which is an insulating film, formed as illustrated in FIG. 12. On the main surface 3a, the plurality of bonding leads 3h are exposed in line from an elongated opening portion 3i (refer to FIG. 9) of the solder resist film 3f. On the back surface 3b, on the other hand, only the lands 3d are exposed. In other words, the solder resist film 3f covers therewith the conductor portions such as copper wires 3g, power feeders 3i and through-holes 3e other than the bonding leads 3h and lands 3d.

A description will next be made of materials of the various constituent members incorporated in the CSP 7. The semiconductor chip 1 is made of, for example, silicon and it has, on the main surface 1a thereof, an integrated circuit. At the periphery of the main surface of the semiconductor chip 1, a plurality of pads is serving as an electrode are formed as illustrated in FIG. 1. Conductive wires 4 for electrically connecting these pads 1c and bonding leads 3h disposed at the periphery (circumference) of the main surface 3a of the package substrate 3 is, for example, a gold wire.

The semiconductor chip 1 is, as illustrated in FIGS. 2 and 3, fixed at the back surface 1b thereof to the package substrate 3 via a die bonding film 2 and it is mounted on the package substrate 3 with the main surface 1a up.

A sealing body 6 for resin-sealing the semiconductor chip 1 and plurality of conductive wires 4 is made of, for example, a thermosetting epoxy resin.

A manufacturing method of the CSP 7 according to Embodiment 1 will next be described based on FIGS. 13 and 14 which are flow charts of the manufacturing process.

First, a substrate is prepared as illustrated in Step S1 of FIG. 13. A substrate 9 having multi-product region prepared here has multiple regions partitioned and arranged thereon and each region corresponds to the formation region of a package substrate 3. In each of the formation regions of the package substrate 3, a substrate having a plurality of bonding leads 3h arranged in a row at the periphery (circumference) of each region is prepared.

A semiconductor chip 1 is then fixed onto the substrate 9 via a die bonding film 2 as illustrated in FIG. 3 by die bonding of Step S2. The die bonding film 2 is, for example, an adhesive layer of a dicing tape member, which is to be used for separating a semiconductor wafer into each piece by dicing, left on the back surface of the wafer.

In each region corresponding to the package substrate 3, a plurality of bonding leads 3h are arranged in a row at the periphery of the region. The semiconductor chip 1 is therefore mounted inside of the row of the bonding leads at the periphery.

Then, wire bonding of Step S3 is performed. As illustrated in FIGS. 3 and 4, the pads 1c on the main surface 1a of the semiconductor chip 1 are electrically connected to the bonding leads 3h of a region of the substrate 9 corresponding to the package substrate 3, respectively via a conductive wire 4 such as gold wire.

In Embodiment 1, reverse bonding is employed for the connection of the bonding leads 3h on the substrate to the pads 1c on the semiconductor chip 1 via the wires 4. In each wire 4, wire bonding is performed so that the top 4b of a loop which is a portion of the wire 4 is disposed outside of the wire connecting portion 4a at the first bond. In other words, wire bonding is performed so that the uppermost position of the loop of each wire 4 exists outside (on the side of the periphery of the package substrate 3) of the center line 13 of the wire connecting portion 4a in the wire delivering direction.

In the wire bonding step, a first bonding is performed for the bonding leads 3h in a region of the substrate 9 corresponding to the package substrate 3. Described specifically, a tip portion of the wire 4 in the ball form is pressed against each of the bonding leads 3h on the substrate as illustrated in FIG. 4 by the capillary 18.

As illustrated in FIG. 6, the capillary 18 is moved in a direction so as to be distant from the semiconductor chip 1, whereby the wire 4 is pulled from the bonding lead 3h. In other words, the wire 4 is pulled obliquely upward from the bonding lead 3h by moving the capillary 18 in a direction so as to be distant from the semiconductor chip 1 and at the same time in an obliquely upward direction.

The transfer of the capillary is terminated at a predetermined position, followed by the transfer of the capillary 18 rightly above (vertically above) as illustrated in FIG. 7 to pull the wire 4 upward.

When the height of the wire 4 exceeds the height of the chip, the upward transfer of the capillary 18 is terminated, followed by substantially horizontal movement of the capillary 18 on the pad 1c of the semiconductor chip 1 as illustrated in FIG. 8, whereby the wire 4 is disposed on the pad 1c of the semiconductor chip 1.

A portion of the wire 4 is crushed against the pad 1c by the capillary 18 to connect the wire 4 to the pad 1c on the semiconductor chip 1, whereby second bonding for connecting the wire 4 to the pad 1c on the semiconductor chip 1 is completed and at the same time, the top 4 of the loop of each wire 4 is disposed outside of the wire connecting portion 4a.

On the pad 1c of the semiconductor chip 1, a gold bump 19 is formed in advance. The wire 4 is connected to the gold bump 19 on the pad 1c at the time of second bonding. The formation of the gold bump 19 on the pad 1c is not always necessary. If it is not formed, the wire 4 is connected to the pad 1c directly.

Resin molding of Step 4 is then performed. Resin sealing is performed while covering all the plurality of regions (a plurality of regions corresponding to the package substrates 3) on the substrate 9 with one cavity 20a of a resin molding mold 20, whereby a full-field sealing body 5 is formed. The sealing resin for forming the full-field sealing body 5 is, for example, a thermosetting epoxy resin.

Figure 14:
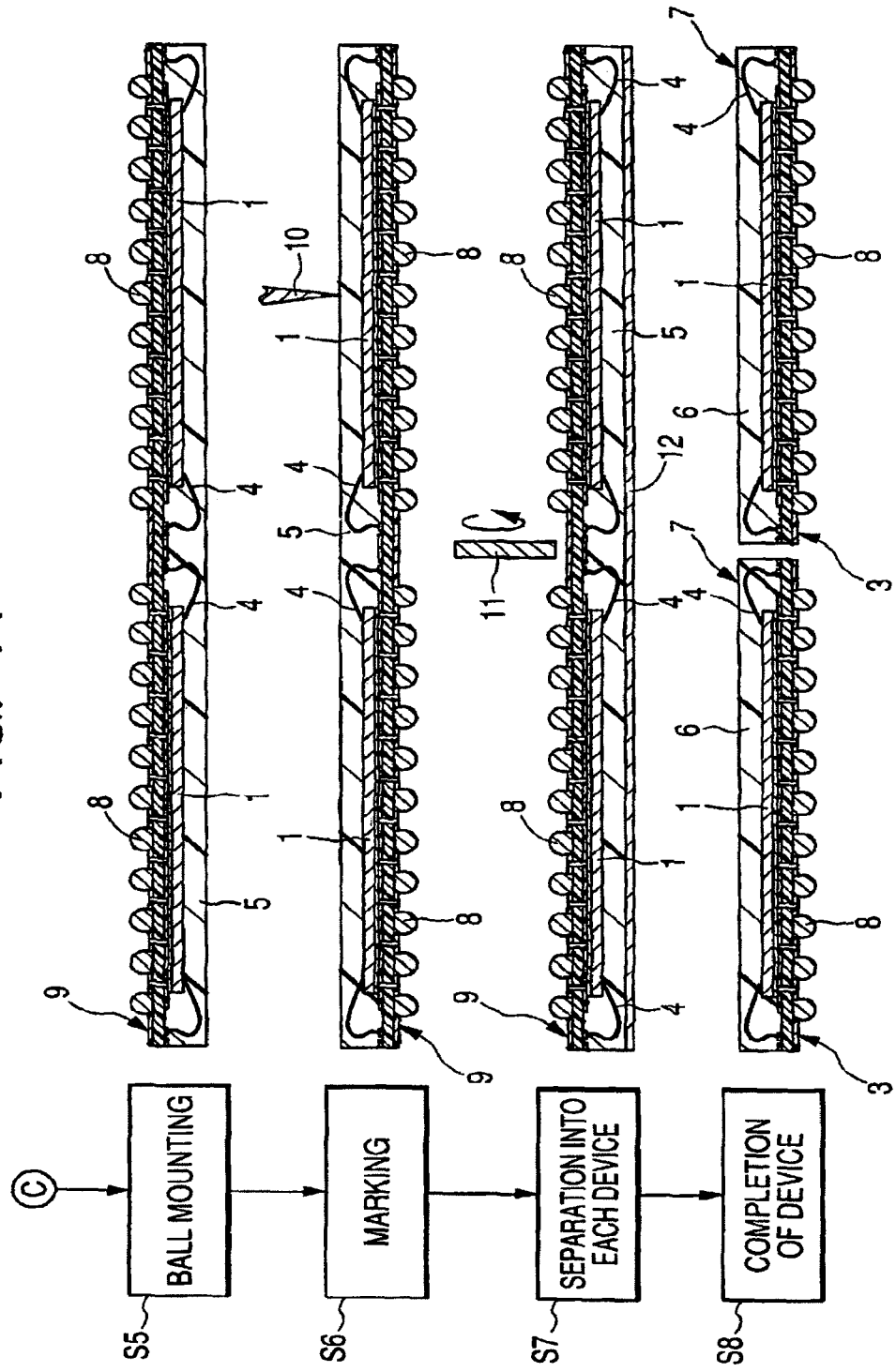
FIG. 14 is a flow chart of a manufacturing process illustrating one example of the fabrication steps after resin molding in the fabrication of the semiconductor device shown in FIG. 1.

After ball mounting of Step S5 illustrated in FIG. 14, solder bumps 8 are connected to lands 3d, respectively as illustrated in FIG. 3.

Marking of Step S6 then follows. Marking 10 to the full-field sealing body 5 is performed by laser marking method or the like. The marking 10 may be performed, for example, by ink marking method.

Then, Step S7 is performed to separate the substrate 9 into each device. In this step, a dicing tape 12 is adhered to the surface of the full-field sealing body 5, followed by cutting into each CSP 7 by a dicing blade 11, while fixing with a dicing tape 12.

The fabrication of CSP 7 is completed as illustrated in Step S8, whereby a target product is obtained.

FIG. 15 is a flow chart of a manufacturing process illustrating a modification example of the fabrication after the resin molding by full-field sealing. In the manufacturing process of this modification example, marking is followed by ball mounting.

In the ball mounting step, a solder is applied to the lands 3d of the package substrate 3, followed by the formation of solder bumps 8 by the reflow treatment. In this ball mounting step, the package substrate 3 warps owing to the reflow treatment. In the marking step, marking is conducted, for example, by the laser marking process. When the package substrate 3 warps, it is difficult to vertically expose the surface of the full-field sealing body 5 to laser and failure in marking on the surface of the full-field sealing body 5 occurs.

In the modification example shown in FIG. 15, the marking step is performed prior to the reflow treatment for the formation of the solder bumps 8 which will otherwise causes the warp of the package substrate 3. This enables to prevent the marking failure.

According to the semiconductor device of Embodiment 1 and manufacturing method thereof, the top 4b of the loop which is a part of each wire connected by reverse bonding is disposed outside the wire connecting portion 4a at the first bond on the bonding lead 3h of the package substrate 3. The wire 4 therefore takes a circuitous course so that the wire length can be increased in the connection between the bonding leads 3h of the package substrate 3 and the pads 1c of the semiconductor chip 1.

This increases a wiring margin and a wire feed rate can therefore follow the moving rate of the capillary 18, whereby the wire 4 can have a stable loop shape.

As a result, shorting between the end portion of the chip and wire 4 can be reduced, occurrence of wire connection failure can be reduced, and wire connection failure can be prevented.

Even if a test pattern is formed at the end portion of the main surface 1a of the semiconductor chip 1, shorting between the test pattern and wire 4 can be reduced.

By making the wire 4 take a circuitous course, the distance from the end portion of the package to the terminal (bonding lead 3h) of the package substrate 3 can be increased and the leak path can be extended so that the margin for avoiding poor moisture absorption can be maintained.

In order to make the wire 4 take a circuitous course, the wire length can be increased even if the top 4b of the loop can be heightened. In this case, however, the sealing body 6 must be thickened in order to prevent exposure of a portion of the wire 4 from the surface side of the sealing body 6. This disturbs thinning of the semiconductor device. In this Embodiment 1, on the other hand, the wire 4 takes a circuitous and laterally extended route so that exposure of a portion of the wire 4 from the surface side of the sealing body can be prevented. In other words, formation of a low-height loop and increase in the wire length can be attained simultaneously so that this Embodiment can be applied to further thinning of the CSP 7.

Moreover, since the wire length can be increased by the formation of a low-height loop, when a request for thinning of the semiconductor device is not so severe it is possible to keep a sufficient thickness from the top 4b of the loop of the wire 4 to the surface of the sealing body 6 by forming the wire 4 with a low-height loop. Even if laser marking is given to the surface of the sealing body 6, risk of exposing the wire 4 from a trench formed by the laser marking or a risk of meltdown of a portion of the wire 4 by, the laser can therefore be reduced.

In addition, by employing a reverse bonding system in wire bonding, descending of the capillary 18 down to an extremely lower side can be avoided at the time of second bonding. This enables to reduce a failure of the wire 4 to enter between the capillary 18 and the end portion of the semiconductor chip 1, a partial contact of the capillary 18 to the wire 4 descended down from the first side to the second side, and wear of the wire 4 at the tip of the capillary 18. The life of the capillary 18 can therefore be extended.

The package substrate 3 according to the modification example of this Embodiment 1 will next be described.

In the package substrate 3 of the modification example illustrated in FIGS. 16 to 19, plating at the conductor portion is formed by electroless plating. As the package substrate 3 illustrated in FIG. 9, no power feeder 3j is formed outside each bonding lead 3h. The solder resist film 3f formed on the main surface 3a is therefore disposed inside of the wire connecting portion 4a on the bonding lead 3h.

The package substrate 3 according to the modification example illustrated in FIGS. 20 to 22 has a power feeder 3j formed outside each bonding lead 3h, while no solder resist film 3f covering therewith the power feeder 3j is formed and both the bonding lead 3h and power feeder 3j are exposed.

Since in the CSP 7, the distance from the end portion of the semiconductor chip 1 to the end portion of the package substrate 3 is about 0.2 to 0.3 mm and is very narrow; and the position accuracy of the solder resist film 3f is as large as ±0.05 mm, the power feeder 3j is exposed without forming the solder resist film 3f in consideration of the displacement which will otherwise occur when the solder resist film 3f is formed over the power feeder 3j.

When the power feeder 3j is exposed, the displacement of the solder resist film 3f can be avoided, but influence of moisture absorption cannot be neglected. When the power feeder 3j is formed outside each bonding lead 3h, it does not matter whether the solder resist film 3f covering the power feeder 3j therewith may be formed or not. If it can be formed in consideration of the distance from the end portion of the chip to the end portion of the substrate, it is preferably formed.

Embodiment 2

Figure 23:
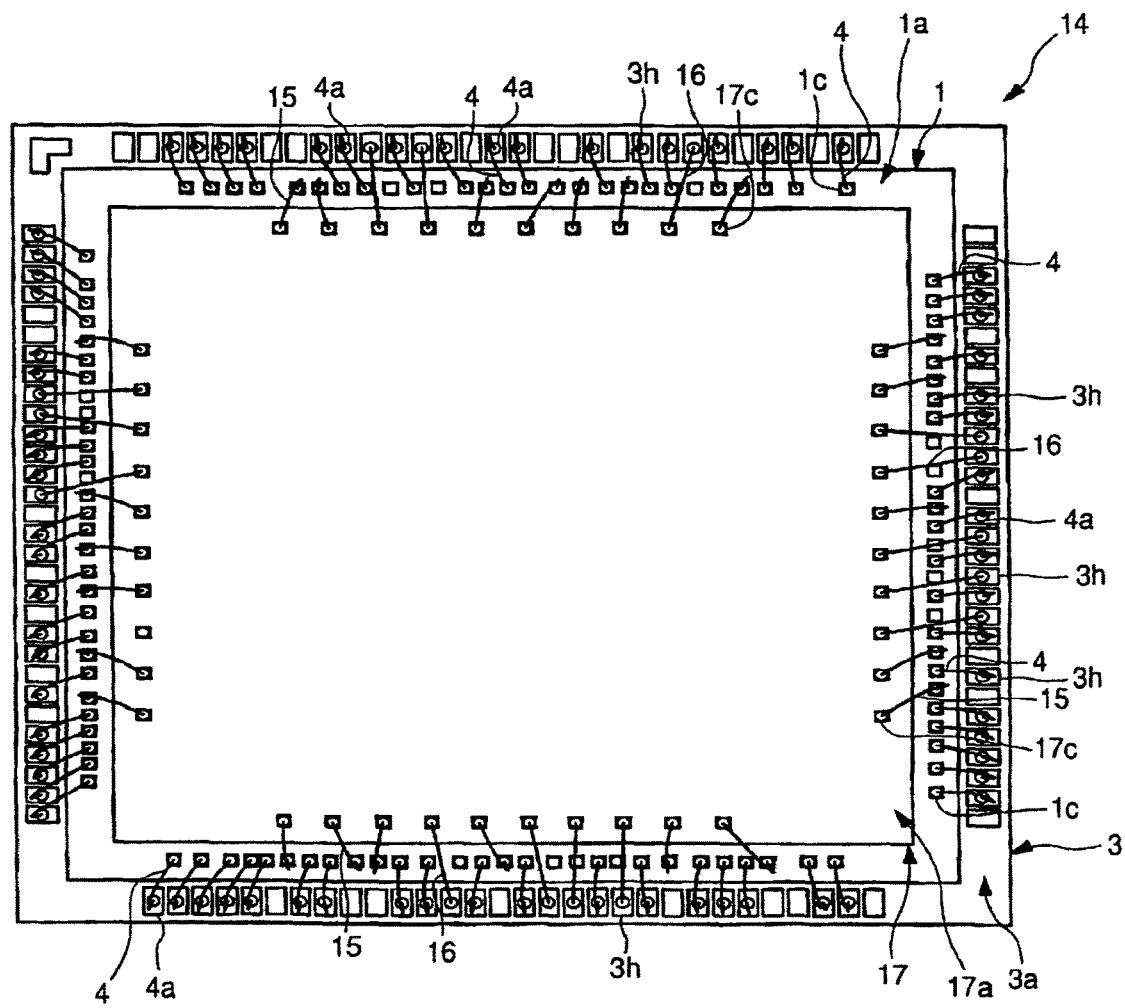
FIG. 23 is a plan view illustrating, through a sealing body, one example of the structure of a semiconductor device according to Embodiment 2 of the present invention.
Figure 24:
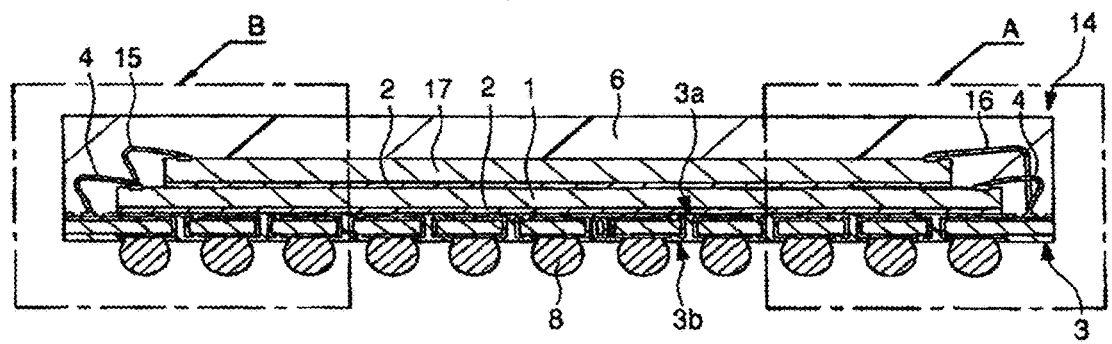
FIG. 24 is a cross-sectional view illustrating one example of the structure of the semiconductor device illustrated in FIG. 23.
Figure 25:
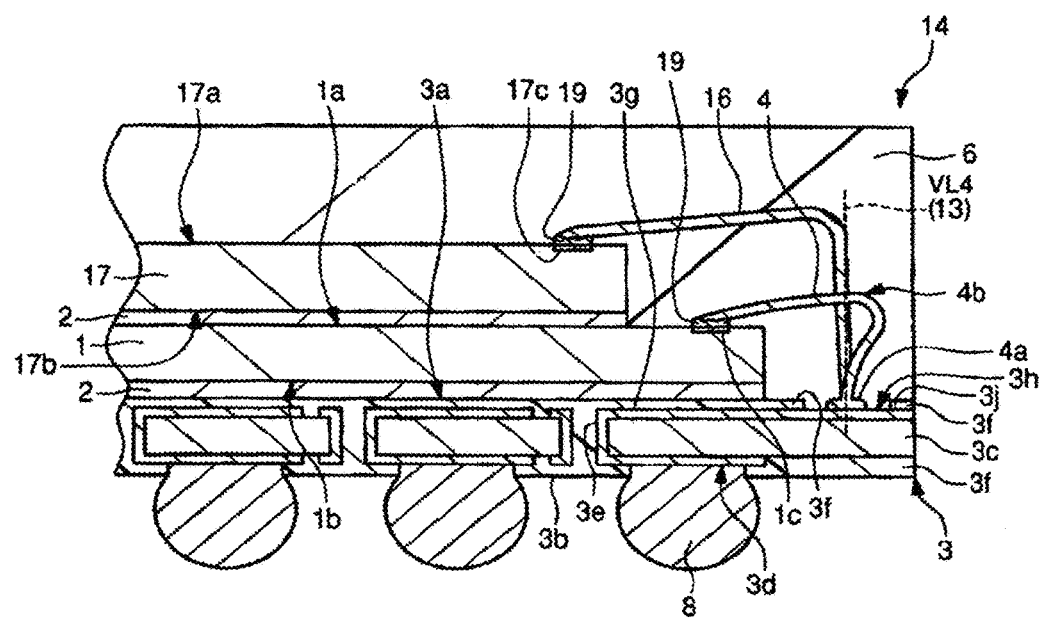
FIG. 25 is an enlarged fragmentary cross-sectional view illustrating the structure of the position A shown in FIG. 24.

FIG. 23 is a plan view illustrating, through a sealing body, one example of the structure of a semiconductor device according to Embodiment 2 of the present invention; FIG. 24 is a cross-sectional view illustrating one example of the structure of the semiconductor device illustrated in FIG. 23; FIG. 25 is an enlarged fragmentary cross-sectional view illustrating the structure of position A shown in FIG. 24; and FIG. 26 is an enlarged fragmentary cross-sectional view illustrating the structure of the position B shown in FIG. 24.

The semiconductor device according to Embodiment 2 illustrated in FIGS. 23 to 26 has, fixed onto a semiconductor chip 1, a second semiconductor chip 17, which is another, semiconductor chip, via a die bonding film 2. Similar to the CSP 7 of Embodiment 1, it is CSP 14 which is a resin sealed type, is small and has a chip stacked structure.

Figure 26:
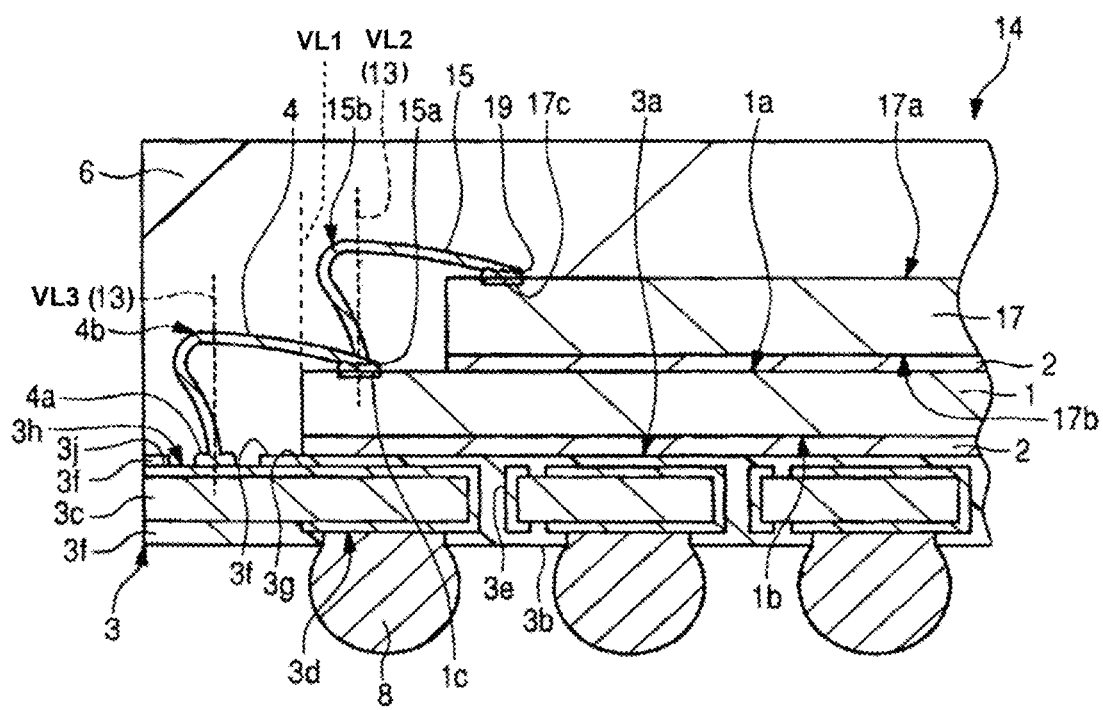
FIG. 26 is an enlarged fragmentary cross-sectional view illustrating the structure of the position B shown in FIG. 24.
Figure 27:
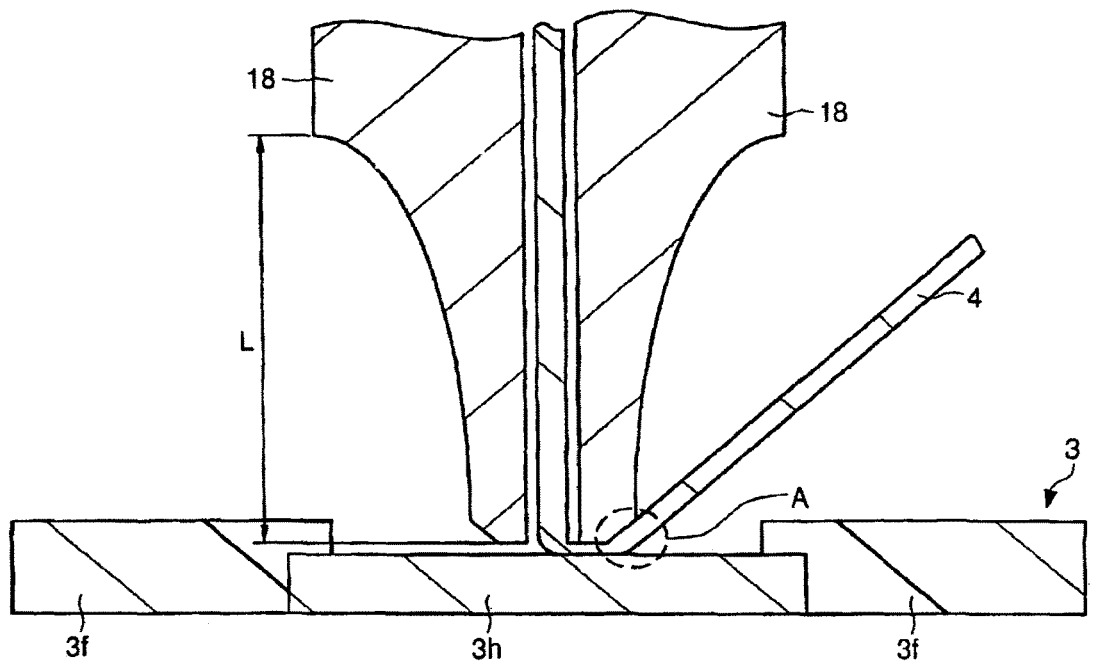
FIG. 27 is an enlarged fragmentary cross-sectional view illustrating one example of a capillary pressed against a bonding lead during wire bonding in Comparative Example.
Figure 28:
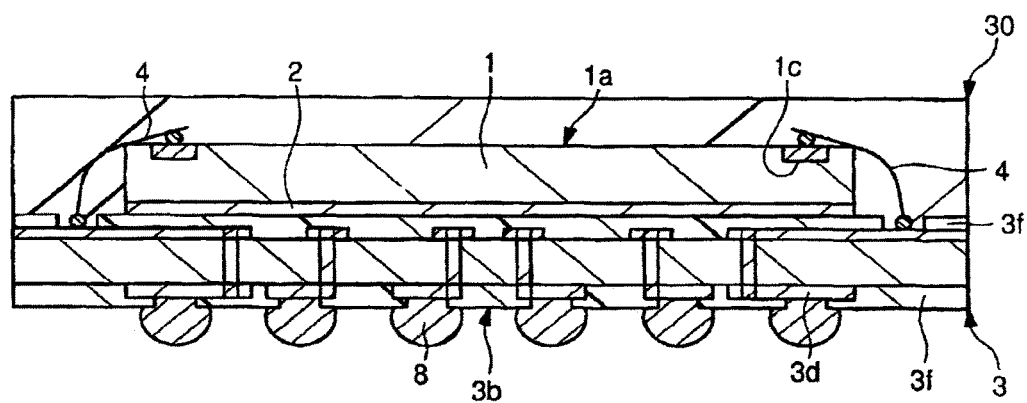
FIG. 28 is a cross-sectional view illustrating the connection failure after wire bonding in Comparative Example.

As illustrated in FIGS. 25 and 26, a semiconductor chip 1 of a first level (lower level) is face-up mounted on a solder resist film 3f on the main surface 3a of a package substrate 3 via a die bonding film 2 with the main surface 1a up. On this semiconductor chip 1, a second semiconductor chip 17 of the second level (upper level) is face-up mounted with its main surface 17a up. At this time, the second semiconductor chip 17 is fixed, at the back surface 17b thereof, onto the main surface 1a of the semiconductor chip 1 via the die bonding film 2.

The CSP 14 is a semiconductor package as small as the CSP 7 of Embodiment 1. Described specifically, in it, the semiconductor chip 1 and the package substrate 3 are almost equal in size and the package substrate 3 is slightly larger. For example, the distance from the end portion of the semiconductor chip 1 to the end portion of the package substrate 3 is about 0.2 to 0.3 mm and is very narrow similar to that of the CSP 7.

As illustrated in FIGS. 25 and 26, both the upper-level and lower-level chips are therefore fabricated by the wire bonding according to a reverse bonding system.

With regard to the wire bonding of the first-level semiconductor chip 1, wire connection to the bonding lead 3h on the substrate side is accomplished by the first bonding, while the wire connection to the pad 1c of the semiconductor chip 1 is accomplished by the second bonding. Similar to the CSP 7 of Embodiment 1, the top 4b of the loop which is a portion of each wire 4 is disposed outside the wire connecting portion 4a. In other words, the uppermost point (4b, here) of the loop of each wire 4 is disposed outside the center line 13 of the wire connecting portion 4a in the wire delivering direction.

In a wire connection of a second wire (another wire) 15 for connecting the pad 1c of the first-level semiconductor chip 1 to the pad 17c of the upper-level (second-level) second semiconductor chip 17, of the wire connections of the second-level second semiconductor chip 17, the top 15b of the loop, which is a portion of the second wire 15, is disposed outside the wire connecting portion 15a similar to the wire 4 because the distance between the pad 1c and pad 17c is short. In other words, the uppermost position (15b here) of the loop of each second wire 15 is disposed outside the center line 13 of the wire connecting portion 15a in the wire deliver direction. Thus, a shown in FIG. 26, considering a first virtual line VL1 perpendicular to the front surface of chip 1 at the left side surface of the chip, and a second virtual line VL2 perpendicular to the front surface where the wire connecting portion 15a contacts the pad 1c, the second wire 15 is formed such that the leftmost portion thereof is located closer to the first virtual line VL1 than to the second virtual line VL2. Also, the entirety of the second wire 15 is spaced apart from the first virtual line VL1. In addition, considering a third virtual line VL3 perpendicular to the surface of the wiring substrate where the wire connecting portion 4a contacts the bonding lead 3h, the wire 4 is formed such that a portion thereof is formed closer than the third virtual line to the left side surface of the sealing body. Also, the entirety of the wire 4 is spaced apart from the left side surface of the sealing body.

A wire connection of a third wire 16 for connecting the bonding lead 3h of the package substrate 3 to the pad 17c of the upper-level (second-level) second semiconductor chip 17, in the wire connections of the second-level second semiconductor chip 17, is accomplished by ordinary reverse bonding as illustrated in FIG. 25. In other words, the distance between the bonding lead 3h and the pad 17c is long and a long wire can therefore be formed in the wire connection between the bonding lead 3h of the package substrate 3 and the pad 17c of the upper-level second semiconductor chip 17 so that the shape of the wire loop can be stabilized. As shown in FIG. 25, considering a fourth virtual line VL4 perpendicular to the surface of the wiring substrate where the wire 16 contacts the bonding lead 3h, the wire 16 is formed such that no portion thereof is located closer to the right-side surface of the sealing body than to the fourth virtual line VL4.

Accordingly, in the wire connection of the second-level second semiconductor chip 17, wire connection so as to dispose the top 15b of the loop of the second wire 15 outside the wire connecting portion 15a is applied only to the wire bonding for connecting the pad 1c of the first-level semiconductor chip 1 to the pad 17c of the second-level second semiconductor chip 17.

Also in the CSP 14 according to Embodiment 2, the tops 4b and 15b of the loops, which are portions of wires, are disposed outside the wire connecting portions 4a and 15a at the first bond, respectively and the wire 4 and second wire 15 are delivered outside in a circuitous route so that the wire length can be increased.

Owing to an increase in the wiring margin for the wire 4 and second wire 15, the wire feed rate can follow the moving rate of the capillary 18, whereby each of the wire 4 and second wire 15 can have a stable loop shape.

As a result, shorting between the end portion of the chip and the wire 4 or second wire 15 can be reduced, occurrence of wire connection failure can be reduced, and wire connection failure can be prevented.

Another structure and another advantage of the CSP 14 according to Embodiment 2 are similar to those of the CSP 7 according to Embodiment 1 so that overlapping description is omitted.

The invention made by the present inventor was described specifically based on some embodiments. It is needless to say that the present invention is not limited to the above-described embodiments and can be modified without departing from the scope or spirit of the present invention.

In Embodiments 1 and 2, for example, BGA small semiconductor packages (CSPs 7 and 14) were given as examples of a semiconductor device. The semiconductor device is not limited to it but may be either an LGA (Land Grid Array) or QFN (Quad Flat Non-leaded Package).

For fixing of the semiconductor chip 1 or second semiconductor chip 17, not only the die bonding film 2, but also an adhesive material in the paste form may be employed.

For ball mounting, not only the above-described method of applying a solder to the lands 3d of the package substrate 3 and then forming the solder bumps 8 by reflow treatment, but also a method of forming balls in advance, and transcribing them to the lands 3d or a method of printing solder via a mask may be employed.

The present invention is suited for an electronic device having a wiring substrate, and a manufacturing technology thereof.

The invention claimed is:
1. A semiconductor device, comprising:
   a wiring substrate including a surface, and a first bonding lead formed on the surface;
   a first semiconductor chip mounted over the surface of the substrate and including a first front surface, a first pad formed on the first front surface, a first back surface opposite to the first front surface, and a first side surface between the first front surface and the first back surface;
   a second semiconductor chip including a second front surface, a second pad formed on the second front surface, a second back surface opposite to the second front surface, and a second side surface between the second front surface and the second back surface;
   a first wire electrically connecting the first pad with the second pad; and
   a sealing body sealing the first semiconductor chip, the second semiconductor chip and the first wire,
   wherein the second semiconductor chip is mounted over the first front surface of the first semiconductor chip such that the second back surface of the second semiconductor chip faces the first front surface of the first semiconductor chip, and such that the second semiconductor chip is spaced apart from the first pad, and such that the second semiconductor chip exposes the first pad in plan view,
   wherein the first wire includes a first part directly contacted with the first pad, and
   wherein, in cross-section view:
   the first side surface of the first semiconductor chip, the first pad of the first semiconductor chip, the second side surface of the second semiconductor chip and the second pad of the second semiconductor chip are located closer to a third side surface of the sealing body than to a fourth side surface of the sealing body, which is opposite to the third side surface, the first wire is formed such that a portion thereof is located closer to a first virtual line than to a second virtual line, and such that an entirety thereof is spaced apart from the first virtual line, the first virtual line is perpendicular to the first front surface at the first side surface, the second virtual line is perpendicular to the first front surface at a location where the first part of the first wire contacts the first pad, and the first wire is configured such that a distance from the second virtual line to a point where the first wire is closest to the first virtual line is smaller than a distance from the second side surface of the second semiconductor chip to the second virtual line.

2. The semiconductor device according to claim 1, wherein a distance from the first virtual line to the second virtual line is less than the distance from the second side surface of the second semiconductor chip to the second virtual line.

3. The semiconductor device according to claim 1, wherein, in cross-section view:

an axis of the first wire is substantially coincident with the second virtual line at the location where the first part of the first wire contacts the first pad, and from the location where the first part of the first wire contacts the first pad, the first wire extends upwardly and outwardly away from the second semiconductor chip toward the first virtual line, bends inwardly toward the second semiconductor chip, and extends across the second virtual line.

4. The semiconductor device according to claim 2, wherein the first semiconductor chip includes a third pad formed on the first front surface, wherein, in cross-section view:

the first bonding lead of the wiring substrate, the first side surface of the first semiconductor chip, the first pad of the first semiconductor chip, the third pad of the first semiconductor chip, the second side surface of the second semiconductor chip and the second pad of the second semiconductor chip are located closer to the third side surface of the sealing body than to the fourth side surface of the sealing body, wherein a second wire electrically connects the first bonding lead with the third pad;

wherein the first semiconductor chip, the second semiconductor chip, the first wire and the second wire are sealed with the sealing body, wherein the first semiconductor chip is mounted over the surface of the wiring substrate such that the first back surface of the first semiconductor chip faces the surface of the wiring substrate, and such that the first semiconductor chip is spaced apart from the first bonding lead, and such that the first semiconductor chip exposes the first bonding lead in plan view, wherein the sealing body includes an upper surface located at the same side as the second front surface of the second semiconductor chip, the third side surface intersecting with the upper surface, and the fourth side surface intersecting with the upper surface, wherein the second wire includes a first part directly contacted with the first bonding lead, and wherein, in cross-section view:

the second wire is formed such that a portion thereof is located closer than a third virtual line to the third side surface of the sealing body, and such that an entirety thereof is spaced apart from the third side surface of the sealing body, the third virtual line being perpendicular to the surface of the wiring substrate at a location where the first part of the second wire contacts the first bonding lead.

5. The semiconductor device according to claim 2, wherein the first semiconductor chip is mounted over the surface of the wiring substrate such that the first back surface of the first semiconductor chip faces the surface of the wiring substrate, and such that the first semiconductor chip is spaced apart from the first bonding lead, and such that the first semiconductor chip exposes the first bonding lead in plan view, wherein the second semiconductor chip includes a third pad formed on the second front surface, wherein, in cross-section view:

the first bonding lead of the wiring substrate and the third pad of the second semiconductor chip are located closer to the fourth side surface of the sealing body than to the third side surface of the sealing body, wherein the third pad is electrically connected with the first bonding lead via a single connecting wire, wherein the first semiconductor chip, the second semiconductor chip, the first wire, and the connecting wire are sealed with the sealing body, wherein the connecting wire includes a first part directly contacted with the first bonding lead, and wherein, in cross-section view:

the connecting wire has no portion located closer to the fourth side surface of the sealing body than to a third virtual line, and the third virtual line is perpendicular to the surface of the wiring substrate at a location where the first part of the connecting wire contacts the first bonding lead.

6. The semiconductor device according to claim 4, wherein a distance from the third side surface to the third virtual line is less than the distance from the first side surface of the first semiconductor chip to the third virtual line.

7. The semiconductor device according to claim 5, wherein the wiring substrate includes a second bonding lead formed on the surface of the wiring substrate, wherein the first semiconductor chip includes a fourth pad formed on the first front surface, wherein, in cross-section view:

the second bonding lead of the wiring substrate, the first side surface of the first semiconductor chip, the first pad of the first semiconductor chip, the third pad of the first semiconductor chip, the second side surface of the second semiconductor chip and the second pad of the second semiconductor chip are located closer to the third side surface of the sealing body than to the fourth side surface of the sealing body, wherein a second wire electrically connects the second bonding lead with the fourth pad;

wherein the first semiconductor chip, the second semiconductor chip, the first wire, the second wire, and the connecting wire are sealed with the sealing body, wherein the sealing body includes an upper surface located at the same side as the second front surface of the second semiconductor chip, the third side surface intersecting with the upper surface, and the fourth side surface intersecting with the upper surface, wherein the second wire includes a first part directly contacted with the second bonding lead, and wherein, in cross-section view:

the second wire is formed such that a portion thereof is located closer than a fourth virtual line to the third side surface of the sealing body, and such that an entirety thereof is spaced apart from the third side surface of the sealing body, the fourth virtual line being perpendicular to the surface of the wiring substrate at a location where the first part of the second wire contacts the second bonding lead.

8. The semiconductor device according to claim 6,
wherein the wiring substrate includes a second bonding lead formed on the surface of the wiring substrate,
wherein the second semiconductor chip includes a fourth pad formed on the second front surface,
wherein, in cross-section view:
the second bonding lead of the wiring substrate and the fourth pad of the second semiconductor chip are located closer to the fourth side surface of the sealing body than to the third side surface of the sealing body,
wherein the fourth pad is electrically connected with the second bonding lead via a single connecting wire,
wherein the first semiconductor chip, the second semiconductor chip, the first wire, the second wire and the connecting wire are sealed with the sealing body,
wherein the connecting wire includes a first part directly contacted with the second bonding lead, and
wherein, in cross-section view:
the connecting wire has no portion located closer to the fourth side surface of the sealing body than to a fourth virtual line, and
the fourth virtual line is perpendicular to the surface of the wiring substrate at a location where the first part of the connecting wire contacts the second bonding lead.

9. The semiconductor device according to claim 7, wherein a distance from the third side surface to the fourth virtual line is less than the distance from the first side surface of the first semiconductor chip to the fourth virtual line.

10. The semiconductor device according to claim 8,
wherein the first wire is electrically connected with the second pad via a first bump,
wherein the second wire is electrically connected with the third pad via a second bump, and
wherein the connecting wire is electrically connected with the fourth pad via a third bump.

11. The semiconductor device according to claim 9,
wherein the first wire is electrically connected with the second pad via a first bump,
wherein the second wire is electrically connected with the fourth pad via a second bump, and
wherein the connecting wire is electrically connected with the third pad via a third bump.

12. The semiconductor device according to claim 10,
wherein the first semiconductor chip is mounted over the surface of the wiring substrate via a first die bonding film, and
wherein the second semiconductor chip is mounted over the first front surface of the first semiconductor chip via a second die bonding film.

13. The semiconductor device according to claim 11,
wherein the first semiconductor chip is mounted over the surface of the wiring substrate via a first die bonding film, and
wherein the second semiconductor chip is mounted over the first front surface of the first semiconductor chip via a second die bonding film.

14. The semiconductor device according to claim 12,
wherein, in cross-section view, the first wire has:
a lower concave portion with a concavity facing toward the first virtual line, and
an upper concave portion with a concavity facing toward the second virtual line, and
wherein, in cross-section view, the second wire has:
a lower concave portion with a concavity facing toward the third side surface of the sealing body, and
an upper concave portion with a concavity facing toward the third virtual line.

15. The semiconductor device according to claim 12,
wherein, in cross-section view:
an axis of the first wire is substantially coincident with the second virtual line at the location where the first part of the first wire contacts the first pad,
an axis of the second wire is substantially coincident with the third virtual line at the location where the first part of the second wire contacts the first bonding lead,
from the location where the first part of the first wire contacts the first pad, the first wire extends upwardly and outwardly away from the second semiconductor chip toward the first virtual line, bends inwardly toward the second semiconductor chip, and extends across the second virtual line, and
from the location where the first part of the second wire contacts the first bonding lead, the second wire extends upwardly and outwardly away from the first semiconductor chip toward the third side surface of the sealing body, bends inwardly toward the first semiconductor chip, and extends across the third virtual line.

16. The semiconductor device according to claim 12, wherein the first pad is one of a row of pads closest to the first side surface of the first semiconductor chip, and the second pad is one of a row of pads closest to the second side surface of the second semiconductor chip.

17. The semiconductor device according to claim 13,
wherein, in cross-section view, the first wire has:
a lower concave portion with a concavity facing toward the first virtual line, and
an upper concave portion with a concavity facing toward the second virtual line, and
wherein, in cross-section view, the second wire has:
a lower concave portion with a concavity facing toward the third side surface of the sealing body, and
an upper concave portion with a concavity facing toward the third virtual line.

18. The semiconductor device according to claim 13,
wherein, in cross-section view:
an axis of the first wire is substantially coincident with the second virtual line at the location where the first part of the first wire contacts the first pad,
an axis of the second wire is substantially coincident with the fourth virtual line at the location where the first part of the second wire contacts the second bonding lead,
from the location where the first part of the first wire contacts the first pad, the first wire extends upwardly and outwardly away from the second semiconductor chip toward the first virtual line, bends inwardly toward the second semiconductor chip, and extends across the second virtual line, and
from the location where the first part of the second wire contacts the second bonding lead, the second wire extends upwardly and outwardly away from the first semiconductor chip toward the third side surface of the sealing body, bends inwardly toward the first semiconductor chip, and extends across the fourth virtual line.

19. The semiconductor device according to claim 13, wherein the first pad is one of a row of pads closest to the first side surface of the first semiconductor chip, and the second pad is one of a row of pads closest to the second side surface of the second semiconductor chip.

* * * * *